(12) United States Patent
Kobayashi

(10) Patent No.: US 8,261,217 B2
(45) Date of Patent: Sep. 4, 2012

(54) PATTERN FORMING METHOD AND PATTERN VERIFYING METHOD

(75) Inventor: Sachiko Kobayashi, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 445 days.

(21) Appl. No.: 12/020,275

(22) Filed: Jan. 25, 2008

(65) Prior Publication Data

US 2008/0184183 A1 Jul. 31, 2008

(30) Foreign Application Priority Data

Jan. 26, 2007 (JP) ................................. 2007-016707

(51) Int. Cl.
*G06F 17/50* (2006.01)
*G06F 9/455* (2006.01)

(52) U.S. Cl. ........ 716/106; 716/101; 716/102; 716/104; 716/105; 716/51; 716/53; 716/54; 716/55

(58) Field of Classification Search ................... 716/1–6, 716/19–21
See application file for complete search history.

(56) References Cited

U.S. PATENT DOCUMENTS

| | | | | |
|---|---|---|---|---|
| 6,078,737 A * | 6/2000 | Suzuki | ............. | 716/52 |
| 6,577,994 B1 * | 6/2003 | Tsukuda | ............. | 703/15 |
| 6,584,599 B2 * | 6/2003 | Fujii | ............. | 716/2 |
| 6,691,297 B1 * | 2/2004 | Misaka et al. | ............. | 716/21 |
| 6,745,372 B2 * | 6/2004 | Cote et al. | ............. | 716/2 |
| 6,871,338 B2 * | 3/2005 | Yamauchi | ............. | 716/52 |
| 7,065,739 B2 * | 6/2006 | Kobayashi et al. | ............. | 716/21 |
| 7,174,520 B2 * | 2/2007 | White et al. | ............. | 716/4 |
| 7,194,704 B2 | 3/2007 | Kotani et al. | | |
| 7,266,801 B2 * | 9/2007 | Kotani et al. | ............. | 716/21 |
| 7,404,165 B2 * | 7/2008 | Misaka et al. | ............. | 716/52 |

(Continued)

FOREIGN PATENT DOCUMENTS

JP 2002-026126 1/2002

(Continued)

OTHER PUBLICATIONS

Kobayashi, et al., "Automated Hot-Spot Fixing System Applied for Metal Layers of 65 nm Logic Devices", Proc. of SPIE, vol. 6283, 62830R, pp. 1-11 (2006).

(Continued)

*Primary Examiner* — Helen Rossoshek
(74) *Attorney, Agent, or Firm* — Finnegan, Henderson, Farabow, Garrett & Dunner, L.L.P.

(57) ABSTRACT

A pattern forming method including modifying design data subjected to a first design rule check in design data of a pattern to be formed in a semiconductor substrate, performing the first design rule check to the modified design data again, outputting the modified design data which does not violate the first design rule as pattern forming design data used in actual pattern formation, and performing a second design rule check having an allowable range wider than that of the first design rule to the modified design data which violates the first design rule, and outputting the modified design data which does not violate the second design rule as the pattern forming design data, and redesigning the pattern to satisfy the second design rule or adjusting the modification guideline such that the modified design data which violates the second design rule satisfies the second design rule.

7 Claims, 10 Drawing Sheets

U.S. PATENT DOCUMENTS

| | | | |
|---|---|---|---|
| 7,454,721 B2 * | 11/2008 | Hibbeler et al. | 716/2 |
| 7,509,623 B2 * | 3/2009 | Kobayasi et al. | 716/21 |
| 7,523,429 B2 * | 4/2009 | Kroyan et al. | 716/9 |
| 7,530,049 B2 * | 5/2009 | Kobayashi et al. | 716/19 |
| 7,552,408 B2 * | 6/2009 | Teh et al. | 716/107 |
| 2006/0206847 A1 * | 9/2006 | Ogawa | 716/9 |
| 2007/0051950 A1 | 3/2007 | Kobayashi et al. | |
| 2007/0168895 A1 * | 7/2007 | Ikeuchi | 716/4 |
| 2008/0235649 A1 * | 9/2008 | Izuha | 716/19 |
| 2009/0007053 A1 * | 1/2009 | Kim | 716/21 |

FOREIGN PATENT DOCUMENTS

| | | |
|---|---|---|
| JP | 2003-142584 | 5/2003 |
| JP | 2005-181524 | 7/2005 |

OTHER PUBLICATIONS

Notification of Reasons for Rejection, issued by Japanese Patent Office, mailed on Jan. 25, 2011, in a counterpart Japanese application No. 2007-016707, 8 pages.

* cited by examiner

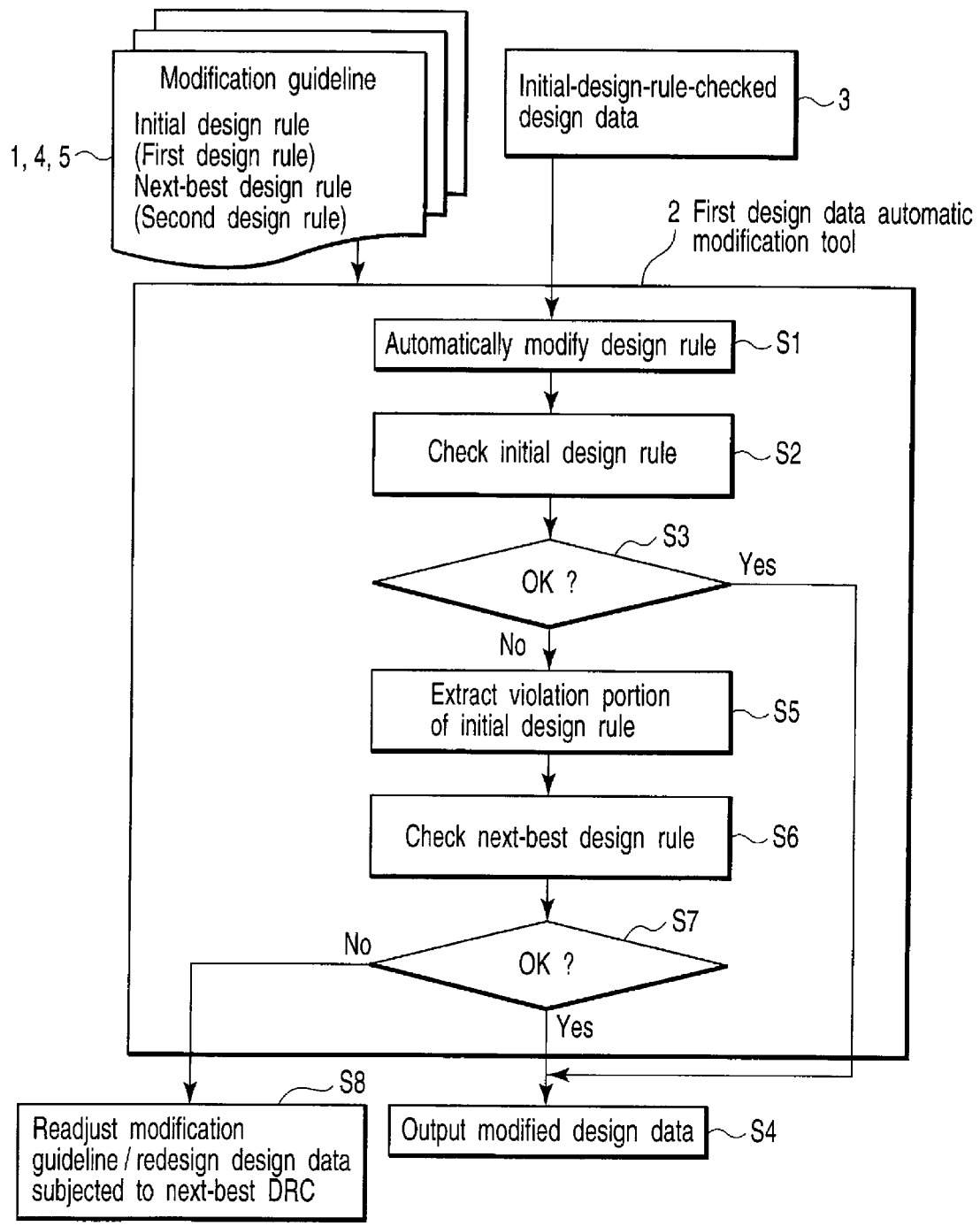
F I G. 1

32

| DR category | Propriety of rule extension | Limit of rule extension | Conformity point | Extend conformity point |
|---|---|---|---|---|
| Rule A | NG |  | 10 |  |
| Rule B | NG |  | 10 |  |
| Rule C | OK | 90nm→85nm | 5 | 2 |
| Rule D | OK | 120nm→100nm | 3 | 1 |
| Rule E | NG |  | 8 |  |
| Rule F | OK | 150nm→130nm | 4 | 2 |

F I G. 4

| Group | Graphic | Edge | Moving distance | Category |
|---|---|---|---|---|
| 1 (48a) | 49a | 2 | 5 | hsp1 |
| | | 6 | -10 | hsp1 |
| | 49b | 2 | 5 | hsp1 |
| | | 3 | 5 | hsp1 |
| 2 (48b) | 49c | 5 | 5 | hsp2 |
| | | 7 | -5 | hsp2 |
| | | 9 | 5 | hsp2 |
| | | 11 | -5 | hsp2 |
| | | 13 | 10 | hsp2 |

FIG. 9

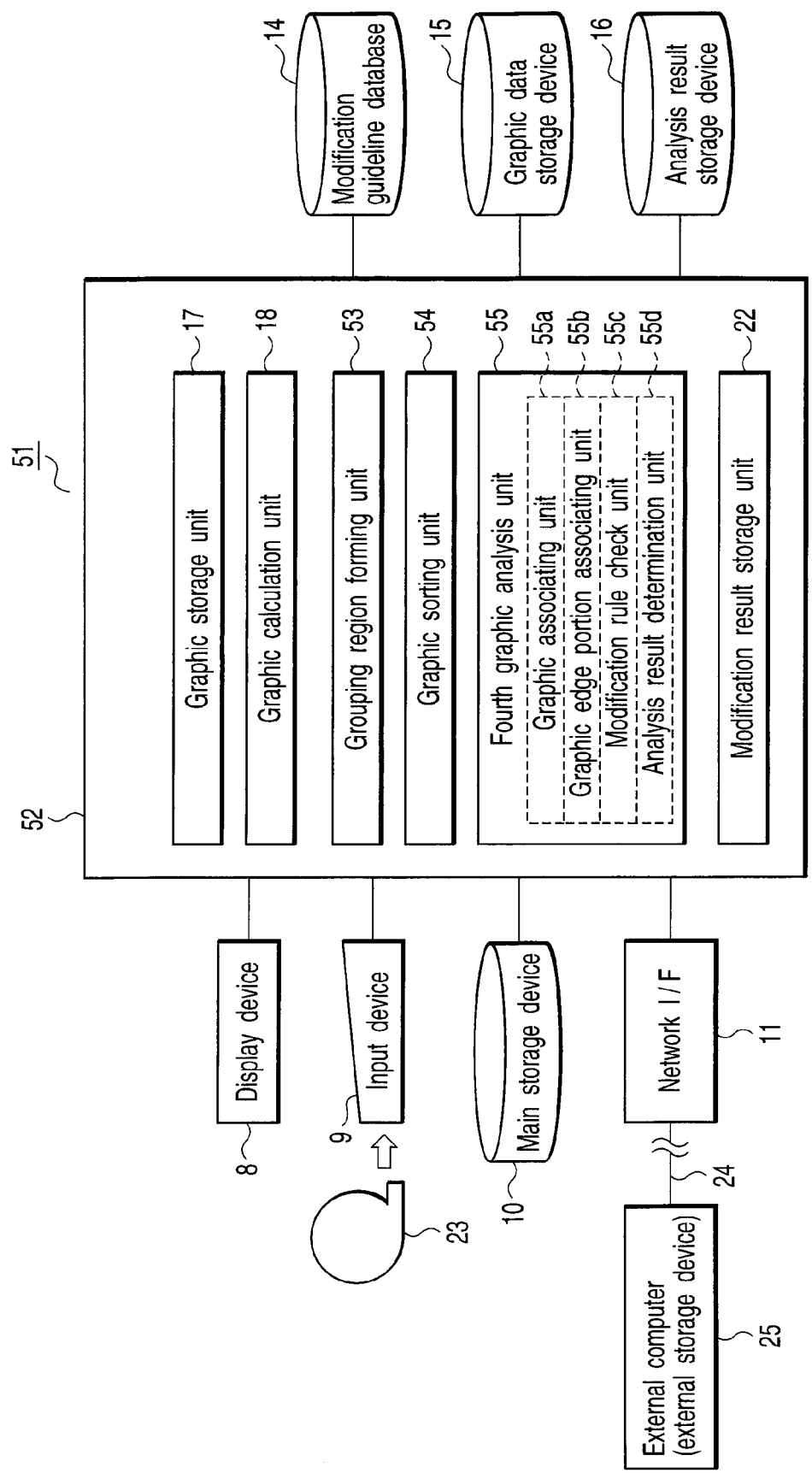
F I G. 10

PATTERN FORMING METHOD AND PATTERN VERIFYING METHOD

CROSS-REFERENCE TO RELATED APPLICATIONS

This application is based upon and claims the benefit of priority from prior Japanese Patent Application No. 2007-016707, filed Jan. 26, 2007, the entire contents of which are incorporated herein by reference.

BACKGROUND OF THE INVENTION

1. Field of the Invention

The present invention relates to a technique of handling design data of a pattern of a semiconductor device and, more particularly, to a pattern forming method and a pattern verifying method which efficiently and uniformly process a series of processes according to data design of the pattern.

2. Description of the Related Art

In recent years, micropatterning and high integration density of a semiconductor device are conspicuous. Accordingly, when process simulation is performed on design data of a pattern designed in conformity with a design rule, although optical proximity correction (OPC), a resolution enhanced technology (RET) process and the like are performed, process dangerous portions where patterns are connected to each other or disconnected from each other at unexpected positions, or line widths or space widths of patterns not satisfying regulated conditions are occasionally found. The following method is disclosed in, for example, Jpn. Pat. Appln. KOKAI Publication No. 2005-181524. That is, with respect to process dangerous portions, at least one of a design rule (DR), a process proximity correction (PPC) parameter, and a semiconductor manufacturing process parameter is repeatedly optimized to create a guideline for changing a design pattern or a layout, and on the basis of the created guideline for changing the design pattern, the design pattern and the layout are partially modified.

For verifying whether a result obtained by partially modifying the design pattern or the layout is correct, several methods are known. For example, it can be automatically verified by performing a design rule check (DRC) as to whether a design rule is satisfied. In addition, it can be automatically verified by a process rule check (PRC) using a process simulator or the like to check whether a dangerous portion predicted on the process is eliminated.

However, even though these verifying methods are used, it cannot be verified whether input design data is correctly modified on the basis of a guideline for modification. More specifically, when a design rule check, process rule check and the like are performed, even though a modification result satisfies the design rule and passes these checks and the predicted process dangerous portions are eliminated, it is impossible to detect the danger that the pattern and the layout might be modified by an unnecessarily large amount of modification in comparison with the pattern and the layout intended by a designer. Since a design target itself is modified by the above modification method, verification performed by "comparison with target" as a general verification cannot be performed, and the propriety of the modification cannot be easily verified.

To satisfy the request of improving the yield, the pattern and the layout may be modified while partially outstripping the design rule to preferentially avoid dangers in processing. In this case, the pattern and the layout are modified on the basis of a guideline for modification which partially violates the design rule. As a result, when a portion which is unexpectedly modified or a portion which is fatally modified is not detected by the process rule check, the modified portions cannot be detected.

In this manner, according to a conventional technique, when design data and a design layout of a pattern initially input in a pattern design process are unexpectedly modified, these modified portions cannot be automatically detected. For this reason, the step of visually verifying modified portions one by one is necessary. The pattern design process thus requires a lot of time and enormous cost. In addition, since criteria for determining pseudo errors and true errors depend on the verifier, mask data having uniform quality cannot be easily created.

BRIEF SUMMARY OF THE INVENTION

According to an aspect of the invention, there is provided a pattern forming method comprising: modifying design data subjected to a first design rule check in design data of a pattern to be formed in a semiconductor substrate on the basis of a modification guideline regulated by a criterion which satisfies at least one of a request on design of the semiconductor device and a request on processes of manufacturing the semiconductor device; performing the first design rule check to the modified design data again; outputting the modified design data which does not violate the first design rule in the modified design data subjected to the first design rule again as pattern forming design data used in actual pattern formation, extracting the modified design data which violates the first design rule, and performing a second design rule check having an allowable range wider than that of the first design rule to the modified design data which violates the first design rule; and outputting the modified design data which does not violate the second design rule in the modified design data subjected to the second design rule check as the pattern forming design data, extracting the modified design data which violates the second design rule, and redesigning the pattern to satisfy the second design rule or adjusting the modification guideline such that the modified design data which violates the second design rule satisfies the second design rule.

According to another aspect of the invention, there is provided a pattern forming method comprising: selecting a part of design data at a portion which does not satisfy at least one of a request on design for a semiconductor device and a request on manufacturing processes for the semiconductor device from design data subjected to a first design rule check of design data of a pattern to be formed in the semiconductor device, and modifying the selected part of the design data on the basis of a modification guideline regulated by a criterion which satisfies at least one of the requests; performing the first design rule check to the modified design data again; outputting the modified design data as pattern forming design data used in actual pattern formation when the modified design data subjected to the first design rule check again does not violate the first design rule, and generating at least one modification candidate pattern which departs from the first design rule when the modified design data violates the first design rule; selecting the modified candidate pattern having a smallest degree of departure from the first design rule with reference to a third design rule which evaluates a degree of departure from the first design rule with respect to the generated modification candidate pattern, and performing a second design rule check having an allowable range wider than that of the first design rule to the design data of the selected modification candidate pattern; ending the second design rule check of the design data of the modification candidate pattern when the design data of the modification candidate pattern subjected to the second design rule check does not violate the second design rule, and excluding the design data of the modification candidate pattern from the pattern forming design data as design data of a modification improper pattern when the design data of the modification candidate pattern violates the second design rule; and repeatedly performing from a step of selecting a part of the design data at the portion which does not satisfy at least one of the requests to a step of ending the second design rule check to the design data of the modification candidate pattern or a step of excluding the design data of the modification candidate pattern from the pattern forming design data, to all the remaining design data which are not selected in the design data at the portion.

According to fur another aspect of the invention, there is provided a pattern forming method comprising: extracting, with respect to design data of a pattern to be formed in a semiconductor device, differences between design data obtained before modification based on a modification guideline regulated by a criterion which satisfies at least one of a request on design for the semiconductor device and a request on manufacturing processes for the semiconductor device is performed and design data obtained after the modification on the basis of the modification guideline is performed; forming at least one group region by grouping the extracted differences for every graphics and sorting the graphics obtained before and after the modification with selecting one group region from the group regions; associating the graphics obtained before and after the modification with each other on the basis of the sorted graphic groups and associating edge portions of the associated graphics obtained before and after the modification; performing a modification rule check on the basis of the modification guideline to movements of the associated edge portions before and after the modification; ending the modification rule check of the design data of the edge portions of the modified graphics when the design data of the edge portions of the modified graphics subjected to the modification rule check does not violate the modification rule, and excluding the design data of the edge portions of the modified graphics from pattern forming design data used in actual pattern formation as design data of a modification violation pattern when the design data violates the modification rule; and repeatedly performing from a step of extracting a difference between the design data obtained before the modification is performed and the design data obtained after the modification is performed to a step of ending the modification rule check to the design data of the edge portions of the modified graphics or a step of excluding the design data of the edge portions of the modified graphics from the pattern forming design data, to all the remaining design data of the design data of the pattern formed in the semiconductor device.

BRIEF DESCRIPTION OF THE SEVERAL VIEWS OF THE DRAWING

FIG. 1 is a flow chart of a pattern forming method according to a first embodiment;

FIG. 4 is a diagram showing a third design rule used in the pattern forming method according to the second embodiment as a table;

FIG. 9 is a diagram showing modification rules used in the pattern verifying method according to the third embodiment as a table; and FIG. 10 is a block diagram simplistically showing a pattern verifying apparatus according to the third embodiment.

DETAILED DESCRIPTION OF THE INVENTION

Figure 2:
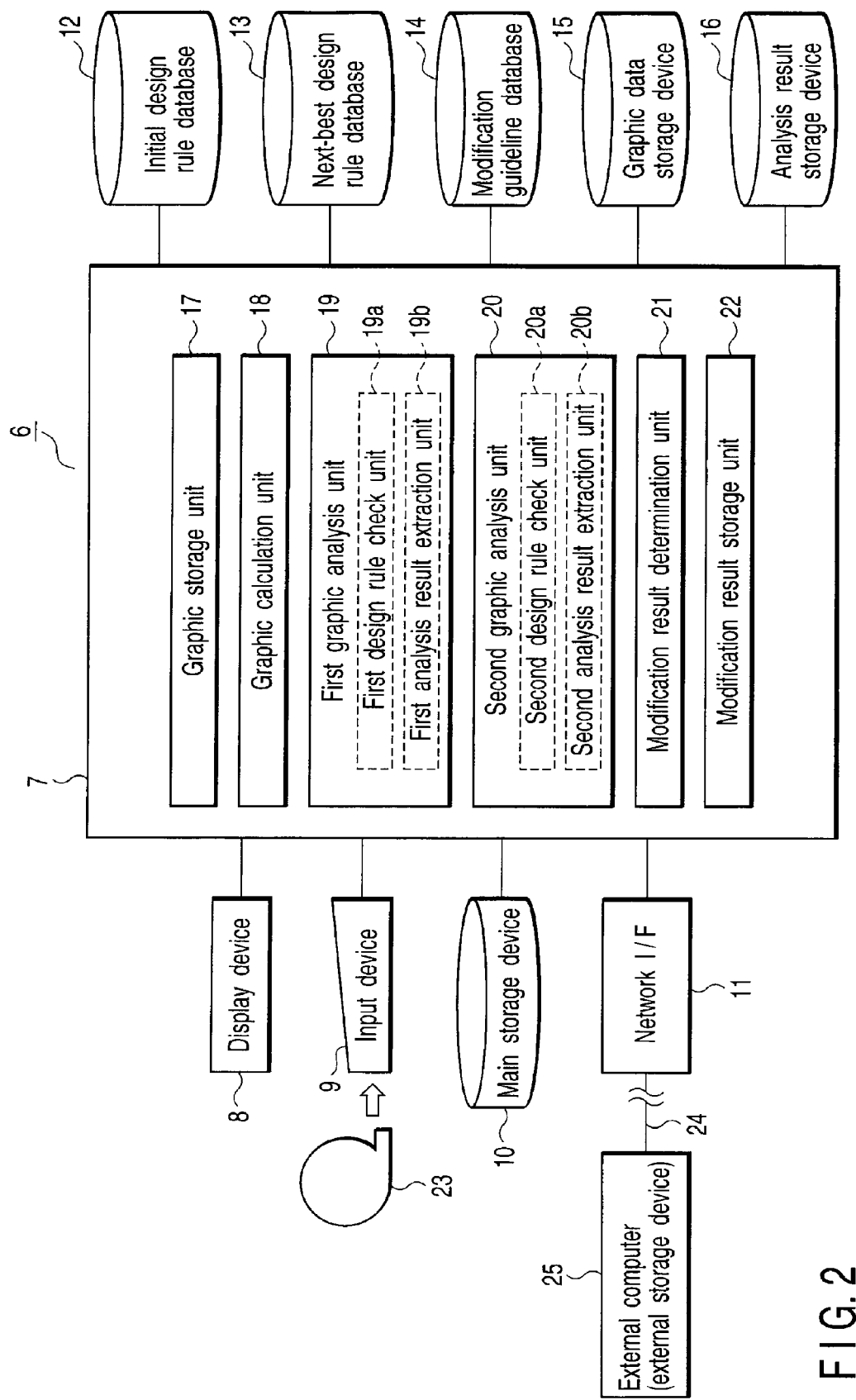
FIG. 2 is a block diagram simplistically showing a pattern forming apparatus according to the first embodiment.

Embodiments according to the present invention will be described below with reference to the accompanying drawings.

First Embodiment

A first embodiment according to the present invention will be described below with reference to FIGS. 1 and 2. In the first embodiment, the following technique will be described. That is, when a process dangerous portion of a pattern is automatically modified prior to actual formation of the pattern to be formed in a semiconductor device, the propriety of design data at the portion modified while partially outstripping a design rule is automatically checked without a manual operation to make it possible to efficiently check the modified portion. Accordingly, a technique which can easily create design data of a proper pattern including a modification which partially outstrips a design rule will be also described below.

A pattern forming method according to the embodiment will be described below with reference to a dangerous portion modifying flow according to the embodiment shown in FIG. 1.

As shown in FIG. 1, prior to execution of a pattern forming method according to the embodiment, in order to check the propriety of design data of a pattern formed in a semiconductor device (not shown), an initial design rule 1 serving as a first design rule (DR) is input to a first design data automatic modification tool 2 according to the embodiment. The first design data automatic modification tool 2 executes processes in step 1 (S1) to step 8 (S8) described below.

The initial design rule 1 is input to the first design data automatic modification tool 2, and error-free design data 3, which has been subjected to first design rule check (DRC) by the initial design rule 1, is also input to the first design data automatic modification tool 2. Accordingly, a next-best design rule 4, serving as a second design rule having an allowable range wider than that of the initial design rule 1, is also input to the first design data automatic modification tool 2. In the next-best design rule 4, it is assumed that a process margin calculated on the safe side in the initial design rule 1 is set to a smallest amount from which a margin in the latest process is cut out. Furthermore, a modification guideline 5 which is regulated on the basis of a criterion which satisfies at least one of a request on design of a semiconductor device and a request on manufacturing processes of the semiconductor device is also input to the first design data automatic modification tool 2. Thereafter, a pattern forming method according to the embodiment is executed by using the first design data automatic modification tool 2.

The design data 3 which is input to the first design data automatic modification tool 2 and from which the error is removed is automatically modified on the basis of the modification guideline 5. This process is defined as step 1 (S1).

The design data modified in step 1 is checked by the initial design rule 1 again. This process is defined as step 2 (S2).

In the initial design rule 1, for example, first and second rules are regulated. More specifically, as the first rule, a thickness or width of a wiring pattern (not shown) is regulated to 100 nm or more. Therewith, a wiring space pattern which is an interval between wiring patterns (not shown) is regulated to 100 nm or more. As a second rule, sizes of fringes on both the sides of the contact pattern (not shown) in an X direction or a Y direction are regulated to 20 nm or more. More specifically, sizes of fringes on both the sides of the contact pattern in a horizontal direction or a vertical direction are regulated to 20 nm or more.

It is then determined whether the modified design data subjected to second initial design rule check in step 2 satisfies the initial design rule 1. This process is defined as step 3 (S3).

When a portion which is determined not to violate the initial design rule 1 is found in the modified design data in step 3, the modified design data of the portion which does not violate the design rule 1 is output as pattern forming design data used in actual pattern formation. This process is defined as step 4 (S4).

In contrast to this, when a portion which is determined to violate the initial design rule 1 is found in the modified design data in step 3, the modified design data at the portion which violates the design rule 1 is extracted. This process is defined in step 5 (S5).

The modified design data at the portion which violates the initial design rule 1 extracted in step 5 is checked by the next-best design rule 4. This process is defined in step 6 (S6).

In the next-best design rule 4, two rules are regulated, for example, as a third rule and a fourth rule. The third and fourth rules, as described above, are set to have allowable ranges wider than those of the first and second rules regulated by the initial design rule 1. More specifically, for the third rule corresponding to the first rule, a thickness or width of a wiring pattern (not shown) is regulated to 90 nm or more. Therewith, a wiring space pattern serving as an interval between wiring patterns (not shown) is regulated to 100 nm or more. As the fourth rule corresponding to the second rule, a size of a fringe on one side of a contact pattern (not shown) in an X direction or a Y direction is regulated to 20 nm or more. More specifically, a size of a fringe on one side of the contact pattern in a horizontal direction or a vertical direction is regulated to 20 nm or more.

It is determined whether the modified design data subjected to the next-best design rule check in step 6 satisfies the next-best design rule 4. This process is defined as step 7 (S7).

When a portion which is determined not to violate the next-best design rule 4 is found in the modified design data in step 7, the control operation shifts to the step 4 to output the modified design data of the portion which does not violate the design rule as pattern forming design data used in actual pattern formation. At this time, coordinates of the modified pattern, the contents of the violated design rule, and the applied next-best design rule 4 are added to the modified design data which satisfies the next-best design rule 4.

In contrast to this, when a portion which is determined to violate the next-best design rule 4 is found in the modified design data in step 7, the modified design data at the portion which violates the design rule is extracted. The design data is redesigned to satisfy the next-best design rule 4. Alternatively, the modification guideline 5 is readjusted such that the modified design data at the portion which violates the next-best design rule 4 satisfies the next-best design rule 4. This process is defined as step 8 (S8).

Thereafter, although a concrete and detailed explanation with drawings are omitted, the modified design data which does not violate the initial design rule 1 output in step 4, the modified design data which does not violate the next-best design rule 4 output in step 7, and the modified design data redesigned to satisfy the next-best design rule 4 in step 8 are sent to a predetermined subsequent step. For example, the modified design data are sent to a mask pattern forming line (not shown) as pattern forming design data used in actual pattern formation.

This is the end of the pattern forming method according to the embodiment. The pattern forming method can be also called a design layout forming method of a semiconductor integrated circuit to form a design pattern of the semiconductor integrated circuit.

A configuration of a pattern forming apparatus 6 according to the embodiment will be described below with reference to FIG. 2. More specifically, the pattern forming apparatus 6 is an apparatus that executes the pattern forming method according to the embodiment described above.

As shown in FIG. 2, the pattern forming apparatus 6 is constituted by an apparatus main body unit 7 serving as a computer (CPU), and peripheral devices thereof. To the apparatus main body unit 7, a display device 8, an input device 9, and a main storage device 10 serving as peripheral devices, and a network interface 11 serving as an input/output unit are connected. In the main storage device 10, the first design data automatic modification tool 2 and a pattern forming/verifying program according to the embodiment are stored through the input device 9 and the network I/F 11. To the apparatus main body unit 7, as the peripheral devices, an initial design rule database 12 serving as a first design rule database, a next-best design rule database 13 serving as a second design rule database, a modification guideline database 14, a graphic data storage device 15, and an analysis result storage device 16 are connected. In the initial design rule database 12, the initial design rule 1 described above is stored as data. Similarly, in the next-best design rule database 13, the next-best design rule 4 described above is stored as data. Similarly, in the modification guideline database 14, the modification guideline 5 described above is stored as data.

As shown in FIG. 2, in the apparatus main body unit 7, a graphic storage unit 17, a graphic calculation unit 18, a first graphic analysis unit 19, a second graphic analysis unit 20, a modification result determination unit 21, and a modification result storage unit 22 are arranged. In the first graphic analysis unit 19, a first design rule check unit 19a and a first analysis result extraction unit 19b are further arranged. Similarly, in the second graphic analysis unit 20, a second design rule check unit 20a and a second analysis result extraction unit 20b are arranged.

The pattern forming/verifying program according to the embodiment will be described below. In particular, the pattern forming/verifying program is a program to realize the pattern forming method according to the embodiment. More particularly, the pattern forming/verifying program operates the pattern forming apparatus 6 to realize the function of the pattern forming apparatus 6, so that the pattern forming method according to the embodiment is executed by the pattern forming apparatus 6.

First, before the pattern forming method according to the embodiment is executed by using the pattern forming apparatus 6, the pattern forming/verifying program and the first design data automatic modification tool 2 according to the embodiment are loaded on the apparatus main body unit 7 in advance. The first design data automatic modification tool 2 is a program which substantially constitutes a part of the pattern forming/verifying program according to the embodiment, or which operates the pattern forming apparatus 6 together with the pattern forming/verifying program according to the embodiment. The pattern forming/verifying program and the first design data automatic modification tool 2 are generally recorded on, for example, a recording medium 23 such as a magnetic disk, an optical disk, or a semiconductor memory. Therefore, the recording medium 23 is loaded on the input device 9 to cause the apparatus main body unit 7 to temporarily read the pattern forming/verifying program and the first design data automatic modification tool 2 recorded on the recording medium 23. Thereafter, the pattern forming/verifying program and the first design data automatic modification tool 2 read by the apparatus main body unit 7 are stored in the main storage device 10 constituted by, for example, a hard disk.

The pattern forming/verifying program and the first design data automatic modification tool 2 stored in the main storage device 10 are loaded onto an auxiliary storage unit such as a cache memory (not shown) in the apparatus main body unit 7.

The initial design rule 1 stored in the initial design rule database 12 is read from the initial design rule database 12 and input to the first design data automatic modification tool 2 stored in the apparatus main body unit 7. Similarly, the next-best design rule 4 stored in the next-best design rule database 13 is read from the next-best design rule database 13 and input to the first design data automatic modification tool 2 stored in the apparatus main body unit 7. Similarly, the modification guideline 5 stored in the modification guideline database 14 is read from the modification guideline database 14 and input to the first design data automatic modification tool 2 stored in the apparatus main body unit 7.

In addition to the above input, the design data 3 which is subjected to the first design rule check on the basis of the initial design rule 1 and from which an error is removed is also input to the first design data automatic modification tool 2 stored in the apparatus main body unit 7. Inputting of the error-free design data 3 to the first design data automatic modification tool 2 may be performed by the same method as that when the pattern forming/verifying program and the first design data automatic modification tool 2 are loaded onto the apparatus main body unit 7. More specifically, a predetermined recording medium (not shown) on which the error-free design data 3 is recorded in advance is set in the input device 9 and loaded on the apparatus main body unit 7, so that the error-free design data 3 is input to the first design data automatic modification tool 2 stored in the apparatus main body unit 7. In the hardware, the error-free design data 3 is stored in the graphic storage unit 17.

Thereafter, the pattern forming/verifying program according to the embodiment is started to operate the apparatus main body unit 7 or the like, so that the step 1 (S1) to step 8 (S8) are executed by the pattern forming apparatus 6. More specifically, main steps of the pattern forming method according to the embodiment are realized by a function, controlled by the first design data automatic modification tool 2, of functions achieved by the pattern forming apparatus 6 operated by the pattern forming/verifying program according to the embodiment (will be described later).

Step 1 (S1) of automatically modifying the error-free design data 3 input to the first design data automatic modification tool 2 on the basis of the modification guideline 5 is executed by the apparatus main body unit 7. In particular, the graphic calculation unit 18 first reads the error-free design data 3 stored in the graphic storage unit 17. The graphic calculation unit 18 then performs predetermined modification of the read error-free design data 3 on the basis of the modification guideline 5. The modification result is stored in the modification result storage unit 22.

Step 2 (S2) of checking the design data modified in step 1 again on the basis of the initial design rule 1 is executed by the apparatus main body unit 7. First graphic data of a pattern or a layout serving as a criterion for check in the second initial design rule check is stored in the graphic data storage device 15. For this reason, in execution of the step 2, the first design rule check unit 19a in the first graphic analysis unit 19 reads first reference graphic data from the graphic data storage device 15. Accordingly, the first design rule check unit 19a reads the error-free design data 3 modified on the basis of the modification guideline 5 from the modification result storage unit 22. Thereafter, the first design rule check unit 19a checks the error-free design data 3 modified on the basis of the modification guideline 5 on the basis of the initial design rule 1 while comparing the data 3 with the first reference graphic data.

Then, step 3 (S3) of determining whether the modified design data subjected to the second initial design rule check in step 2 satisfies the initial design rule 1 is executed by the apparatus main body unit 7. This step 3, in particular, is also performed by the first design rule check unit 19a. However, the step S3 may be set to be performed by the modification result determination unit 21.

When a portion determined by the first design rule check unit 19a not to violate the initial design rule 1 is found in the modified design data in step 3, step 4 (S4) of outputting the modified design data at the portion which does not violate the initial design rule 1 as pattern forming design data used in actual pattern formation is executed by the first graphic analysis unit 19. In particular, the first graphic analysis unit 19 temporarily moves the modified design data at a portion which does not violate the initial design rule 1 from the graphic storage unit 17 to the modification result storage unit 22 and stores the design data in the modification result storage unit 22.

In contrast to this, when the portion determined by the first design rule check unit 19a to violate the initial design rule 1 is found in the modified design data in step 3, step 5 (S5) of extracting the modified design data at the portion which violates the initial design rule 1 is executed by the first graphic analysis unit 19. In particular, the first analysis result extraction unit 19b in the first graphic analysis unit 19 extracts the modified design data at a portion which violates the initial design rule 1 and temporarily stores the modified design data.

Step 6 (S6) of checking the modified design data extracted in step 5 and being at the portion which violates the initial design rule 1 by the next-best design rule 4 is executed by the apparatus main body unit 7. In particular, the step 6 is executed by the second graphic analysis unit 20. The second graphic analysis unit 20 has the second design rule check unit 20a and the second analysis result extraction unit 20b as described above, and has the same internal structure as that of the first graphic analysis unit 19. The second graphic data of a pattern or a layout serving as a criterion for check in the next-best design rule check is stored in the graphic data storage device 15 like the first graphic data used in the initial design rule check.

For this reason, in execution of step 6, the second design rule check unit 20a in the second graphic analysis unit 20 reads second reference graphic data from the graphic data storage device 15. Accordingly, the second design rule check unit 20a receives the design data extracted in step 5 and being at the portion which violates the initial design rule 1 from the first analysis result extraction unit 19b of the first graphic analysis unit 19. Thereafter, the second design rule check unit 20a checks the modified design data at the portion which violates the initial design rule 1 on the basis of the next-best design rule 4 while comparing the data with the second reference graphic data.

Step 7 (S7) of determining whether the modified design data subjected to the next-best design rule check in step 6 satisfies the next-best design rule 4 is executed by the apparatus main body unit 7. The step 7 is concretely performed by the second design rule check unit 20a. However, the step S7 may be set to be performed by the modification result determination unit 21.

When a portion determined by the second design rule check unit 20a not to violate the next-best design rule 4 is found in the modified design data in step 7, the step 4 is executed by the second graphic analysis unit 20. Specifically, the second graphic analysis unit 20 outputs the modified design data at a portion which does not violate the design rule as pattern forming design data used in actual pattern formation. In particular, the second graphic analysis unit 20 temporarily moves the modified design data at a portion which does not violate the next-best design rule 4 from the second design rule check unit 20a to the modification result storage unit 22 and stores the design data in the modification result storage unit 22.

In contrast to this, when the portion determined by the second design rule check unit 20a to violate the next-best design rule 4 is found in the modified design data in step 7, step 8 (S8) is executed by the graphic calculation unit 18. In particular, the second analysis result extraction unit 20b in the second graphic analysis unit 20 extracts the modified design data at a portion which violates the next-best design rule 4 from the second design rule check unit 20a. Subsequently, the second analysis result extraction unit 20b sends the modified design data extracted from the second design rule check unit 20a to the graphic calculation unit 18. Thereafter, the graphic calculation unit 18 redesigns a pattern at a portion corresponding to the modified design data sent from the second analysis result extraction unit 20b to satisfy the next-best design rule 4. Alternatively, the graphic calculation unit 18 readjusts the modification guideline 5 such that the modified design data at the portion which violates the next-best design rule 4 satisfies the next-best design rule 4.

Thereafter, although a concrete detailed explanation with drawings will be omitted, the following operation is executed by the apparatus main body unit 7. That is, the modified design data which is stored in the modification result storage unit 22 in step 4 and which does not violate the initial design rule 1, the modified design data which is stored in the modification result storage unit 22 in step 7 and which does not violate the next-best design rule 4, and the modified design data which is redesigned to satisfy the next-best design rule 4 in step 8 are sent toward predetermined subsequent steps. For example, the apparatus main body unit 7 sends the modified design data stored in the modification result storage unit 22 toward a mask pattern forming line (not shown) through the network I/F 11 as pattern forming design data used in actual pattern formation.

This is the end of the pattern forming method realized by using the pattern forming/verifying program according to the embodiment, the pattern forming/verifying function of the pattern forming apparatus 6 executed by the program, and the pattern forming apparatus 6 operated by the pattern forming/verifying program according to the embodiment.

As described above, according to the first embodiment, design data related to a wiring pattern or an element layout in a semiconductor device is automatically modified according to a request on design or a request on manufacturing processes without a manual operation to make it possible to efficiently create proper design data. Specifically, design data of a wiring pattern or an element layout at a portion having a small process margin in the steps of manufacturing a semiconductor device are automatically modified to satisfy a request on design or a request on manufacturing processes to make it possible to efficiently create proper design data. In this manner, the turnaround time (TAT) to create the design data modified to satisfy the request on design or the request on manufacturing processes can be shortened, and the cost for creating the modified design data can be reduced.

In the first embodiment, design rules of two types, i.e., the initial design rule 1 set by a stricter criterion and the next-best design rule 4 set by a criterion which is more moderate than the initial design rule 1 are prepared. Even though the modified design data does not satisfy the initial design rule 1, the modified design data may be set to satisfy only the next-best design rule 4. In this manner, a yield in the step of creating modified design data can be avoided from being considerably deteriorated, and the yield can be improved.

In contrast to this, with respect to the conventional technique, it is assumed that although the design data before automatic modification has no violation portion as a result of the design rule check, the presence of a dangerous portion of a short-circuit error is predicted by process simulation performed before actual pattern formation. It is assumed that, although the dangerous portion required to be modified is automatically modified on the basis of the modification guidance, a portion where a wiring thickness is smaller than about 100 nm set by the design rule is generated. Accordingly, it is not satisfied that margins on both the sides of a fringe between the contact and the wiring layer are set to about 20 nm. Since the design data violates the normal design rule, the design data cannot be directly sent. In such a case, according to a conventional method, a design engineer, a process engineer, a device engineer or the like visually verifies the modified portion and signs off on the design data to send the design data. However, in the above method, since a human determination, which is subjective, is made for checking whether a modification is good or defective, a criterion is not constant, and a manual operation is required. For this reason, a lot of time is consumed to verify the design data.

More specifically, in the conventional technique, shortening of the turnaround time to create properly modified design data which satisfies a request on design or a request on manufacturing processes is almost impossible, as is reduction in the cost for creating the modified design data. Furthermore, in the conventional technique, a criterion for determining whether a modification is good or defective depends on a subjective determination of a human being, which means that such criterion is unstable. For this reason, a variation in yield in the steps of creating modified design data cannot be avoided. Therefore, in the conventional technique, it is substantially impossible that the yield in the steps of creating the modified design data is always increased.

In contrast to this, in the embodiment, as described above, the pattern forming apparatus 6 is operated by the pattern forming/verifying program to make it possible to cause the computer to execute the pattern forming/verifying step without a manual operation. In this manner, formation, modification, verification and the like of design data of a pattern or a layout can be efficiently and uniformly performed according to requests on a manufacturing process of a semiconductor device or a pattern design process.

The pattern forming/verifying program and the first design data automatic modification tool 2 need not be recorded on the recording medium 23. The pattern forming/verifying program and the first design data automatic modification tool 2, as shown in FIG. 2, may be stored in various external computers 25, a storage device 25 or the like connected to the pattern forming apparatus 6 via an electric communication line 24 such as a LAN or the Internet. For example, the pattern forming/verifying program and the first design data automatic modification tool 2 may be stored in a computer 25, a server 25 or the like higher rank computer than the pattern forming apparatus 6 such as a host computer which manages all the series of processes of manufacturing a semiconductor device. In this case, the pattern forming/verifying program and the first design data automatic modification tool 2 may be temporarily read by the apparatus main body unit 7 from the external computer 25 or the external storage device 25 through the electric communication line 24 and the network I/F 11, and then stored in the main storage device 10. The electric communication line 24 may be of a wired type or a wireless type.

Similarly, the error-free design data 3 may be loaded on the apparatus main body unit 7 through the electric communication line 24 and the network I/F 11. According to the method, the error-free design data 3 can be stored in the graphic storage unit 17 or input to the first design data automatic modification tool 2 stored in the apparatus main body unit 7.

Analysis results obtained by the first and second graphic analysis units 19 and 20 are stored in the analysis result storage device 16 at any time. More specifically, the results obtained in steps 2, 4, 5, and 6 are stored in the analysis result storage device 16 at any time.

Furthermore, the step 1 to the step 8 can be checked by the display device 8 in real time at any time.

Second Embodiment

A second embodiment according to the present invention will be described below with reference to FIGS. 3, 4, and 5. The same reference numerals as in the first embodiment denote the same parts in the second embodiment, and a description thereof will be omitted.

In the embodiment, in addition to the first and second design rules used in the first embodiment, a third design rule is used. The second embodiment will be described below in detail.

A pattern forming method according to the embodiment will be described below with reference to a dangerous portion modifying flow shown in FIG. 3. The pattern forming method according to the embodiment modifies the dangerous portion in conformity with a design rule, depending on the necessity of the design rule.

Figure 3:
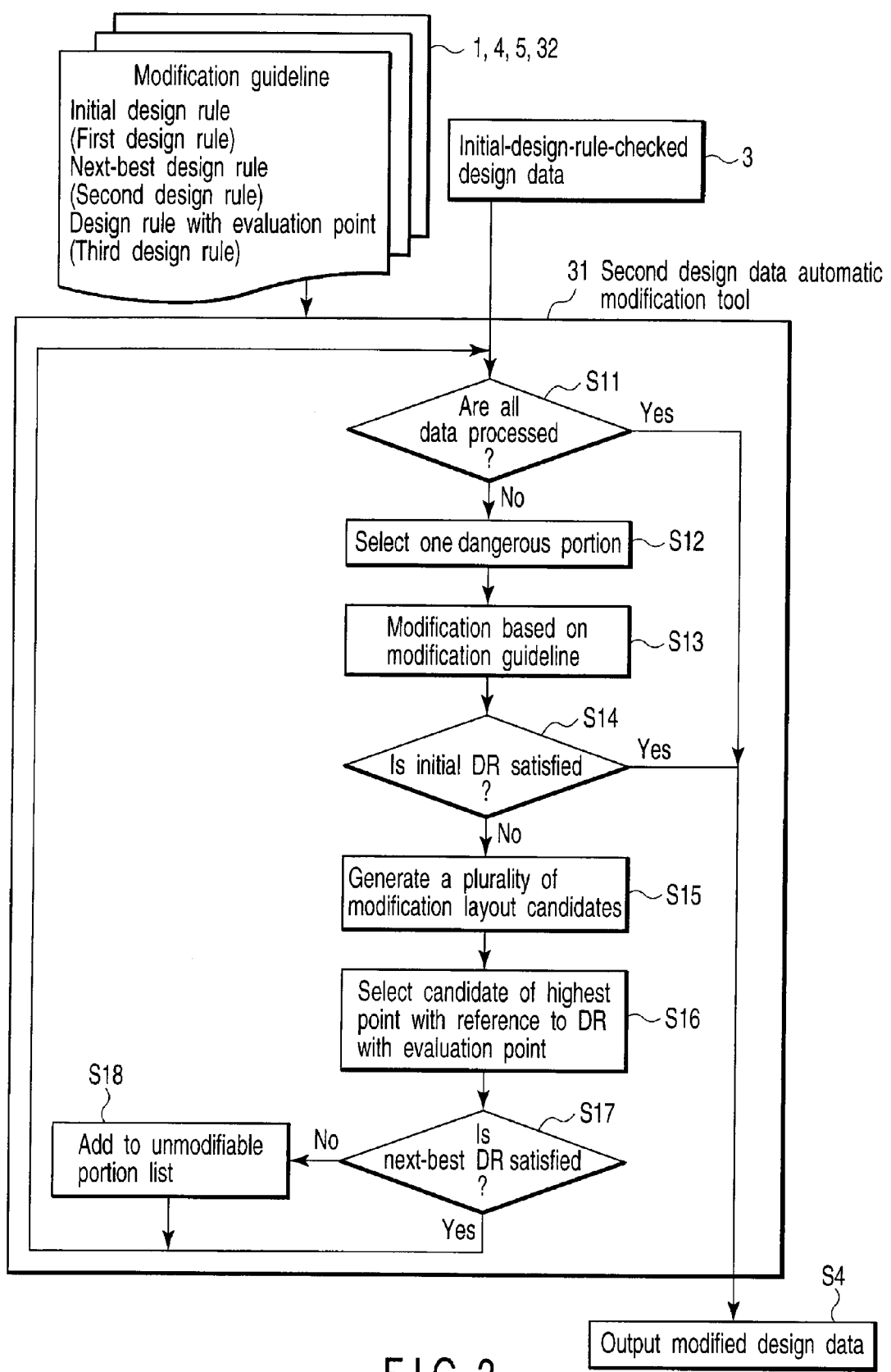
FIG. 3 is a diagram showing a flow chart of a pattern forming method according to a second embodiment.

As shown in FIG. 3, prior to execution of the pattern forming method according to the embodiment, an initial design rule 1, design data 3 which is subjected to first design rule check by the initial design rule 1 and from which an error is removed, a next-best design rule 4, and a modification guideline 5 are input to a second design data automatic modification tool 31 according to the embodiment. The second design data automatic modification tool 31 executes processes according to step 11 (S11) to step 18 (S18) (will be described later) and step 4 (S4) described in the first embodiment. The second embodiment is substantially the same as the first embodiment so far. In the second embodiment, in addition to the initial design rule 1 and the next-best design rule 4, a third design rule 32 different from the design rules 1 and 4 is further input to the second design data automatic modification tool 31. Thereafter, the pattern forming method according to the second embodiment will be executed by using the second design data automatic modification tool 31.

In the second embodiment, as will be described later, when the error-free design data 3 input to the second design data automatic modification tool 31 violates a second initial design rule check, at least one modification candidate pattern (not shown) which departs from the initial design rule 1 is generated. With reference to the evaluation-point-included design rule 32 serving as the third design rule which evaluates the degree of departure from the initial design rule 1 with respect to the generated modification candidate pattern, a modification candidate pattern having the smallest degree of departure from the initial design rule 1 is selected.

It is determined whether step 12 (S12) to step 17 (S17) or step 18 (S18) (will be described later) are finished with respect to all the error-free design data 3 input to the second design data automatic modification tool 31. This step is defined as step 11 (S11). As a matter of course, in the first step 11, processes in step 12 to step 18 are not finished at all. Therefore, at least in the first step 11, it is not necessary to determine whether the processes in step 12 to step 18 are finished. In this case, the first step 11 is not substantially executed, and the control operation may immediately shift to the next step 12.

One piece of design data at a dangerous portion to be modified is selected from the error-free design data 3 input to the second design data automatic modification tool 31. In particular, a part of the design data at a portion which does not satisfy at least one of a request on design of a semiconductor device and a request on manufacturing processes of a semiconductor device is selected from the error-free design data 3 which is subjected to the first initial design rule check. This process is defined as step 12 (S12).

The design data selected in step 12 is automatically modified on the basis of the modification guideline 5. This step is defined as step 13 (S13).

The design data modified in step S13 is checked by the initial design rule 1. It is determined whether the modified design data subjected to the second initial design rule check satisfies the initial design rule 1. The step is defined as step 14 (S14).

When it is determined that the modified design data subjected to the second initial design rule check in step 14 does not violate the initial design rule 1, the control operation shifts to step 4 as in the first embodiment described above. More specifically, the modified design data determined not to violate the initial design rule 1 is output as pattern forming design data used in actual pattern formation.

In contrast to this, when it is determined that the modified design data subjected to the second initial design rule check in step 14 violates the initial design rule 1, new design data to replace the modified design data determined to violate the initial design rule 1 is created. In particular, at least one piece of design data of the modification candidate pattern departing from the initial design rule 1 is generated. In the embodiment, as the design data of the modification candidate pattern departing from the initial design rule 1, a plurality of design data serving as modified layout candidates which outstrip the initial design rule 1 are generated. This step is defined as step 15 (S15).

Design data of a modified layout candidate having the smallest degree of departure from the initial design rule 1 is selected from the design data of the modification layout candidates generated in step 15. At this time, the design rule 32 with an evaluation point which indicates the degree of departure of each of the modified layout candidates from the initial design rule 1 and which is obtained by evaluating an outstripping degree of the initial design rule 1 is referred to. The step is defined as step 16 (S16).

FIG. 4 shows an example of the evaluation-point-included design rule 32 as a table. The evaluation-point-included design rule 32, in particular, as shown in FIG. 4, is constituted by design rules of a plurality of categories serving as modified layout candidates. As the rules constituting the evaluation-point-included design rule 32, the propriety of extension of the design rule, a limit of the extension of the design rule, a priority used in conformity with the design rule, a priority used in conformity with the extended design rule, and the like are set for each category. A modified layout candidate modified to outstrip the initial design rule 1 is marked on the basis of the evaluation-point-included design rule 32 having the above configuration.

In the embodiment, the evaluation-point-included design rule 32 is constituted by design rules of six categories, for example, A, B, C, D, E, and F. The evaluation-point-included design rule 32 shows whether the design rules of the categories A to F may be outstripped. In particular, it is expressed as OK or NG whether each of the design rules of the categories A to F may be extended. A limit to the design rule which may be extended is also expressed by using a concrete numerical value. Regardless of whether the design rules may be extended, priorities in conformity with the design rules of A to F are expressed as scores of 1 to 10. Furthermore, for the design rules which may be extended, priorities used in conformity with the extended design rules are expressed by scores of 1 to 10. As a conformity point of the extended design rules, a high score is added as the degree of departure from the initial design rule 1 is small. More specifically, the evaluation point given to the extended design rule increases as the degree by which the initial design rule 1 is outstripped is small.

In step 16, with reference to the evaluation-point-included design rule 32, a design rule which may be extended is selected from the design rules of the plurality of categories. Subsequently, from the design rule which may be extended, a modified layout candidate having the maximum conformity point is selected. In the embodiment, from the design rules of the categories A to F shown in FIG. 4, design rules C, D, and F which may be extended are selected. Subsequently, of the design rules C, D, and F, the design rule C and the design rule F having two points, which are higher than the conformity point of the design rule D, which is one, are selected and employed as the modified layout candidates.

The design data of the modified layout candidates selected in step 16 are checked by the next-best design rule 4. It is determined whether the design data of the modified layout candidates subjected to the next-best design rule check satisfies the next-best design rule 4. This step is defined as step 17 (S17).

When it is determined in step 17 that the design data of the modified layout candidates employed in step 16 does not violate the next-best design rule 4, the design data is employed as pattern forming design data used in actual pattern formation to end the next-best design rule check. Thereafter, the control operation returns to step 11 to shift to a process for the next modification candidate.

In contrast to this, when it is determined in step 17 that the design data of the modified layout candidate employed in step 16 violates the next-best design rule 4, the design data is excluded from the pattern forming design data to end the next-best design rule check. In this case, the design data of the modified layout candidate excluded from the pattern forming design data is added to an unmodifiable portion list as design data of a modification improper pattern. This step is defined as step 18 (S18). Thereafter, the control operation returns to step 11 to shift to a process for the next modification candidate.

Subsequently, the processes from step 11 to step 17 or step 18 are repeatedly executed on all the remaining design data 3 which are not selected in the first step 12 in all the design data 3 input to the second design data automatic modification tool 31 and checked by the initial design rule 1. After it is determined in step 11 that the processes in step 11 to step 17 or step 18 are performed on all the error-free design data 3 input to the second design data automatic modification tool 31, the control operation shifts to step 4. More specifically, the modified design data determined to satisfy the initial design rule 1 in step 14 and the design data of the modified layout candidate determined to satisfy the next-best design rule 4 in step 17 are output as pattern forming design data used in actual pattern formation.

Thereafter, although a concrete and detailed explanation with drawings will be omitted, as in the first embodiment, the design data output as the pattern forming design data used in the actual pattern formation in step 4 is sent to a mask pattern forming line (not shown). This is the end of the pattern forming method according to the embodiment.

Figure 5:
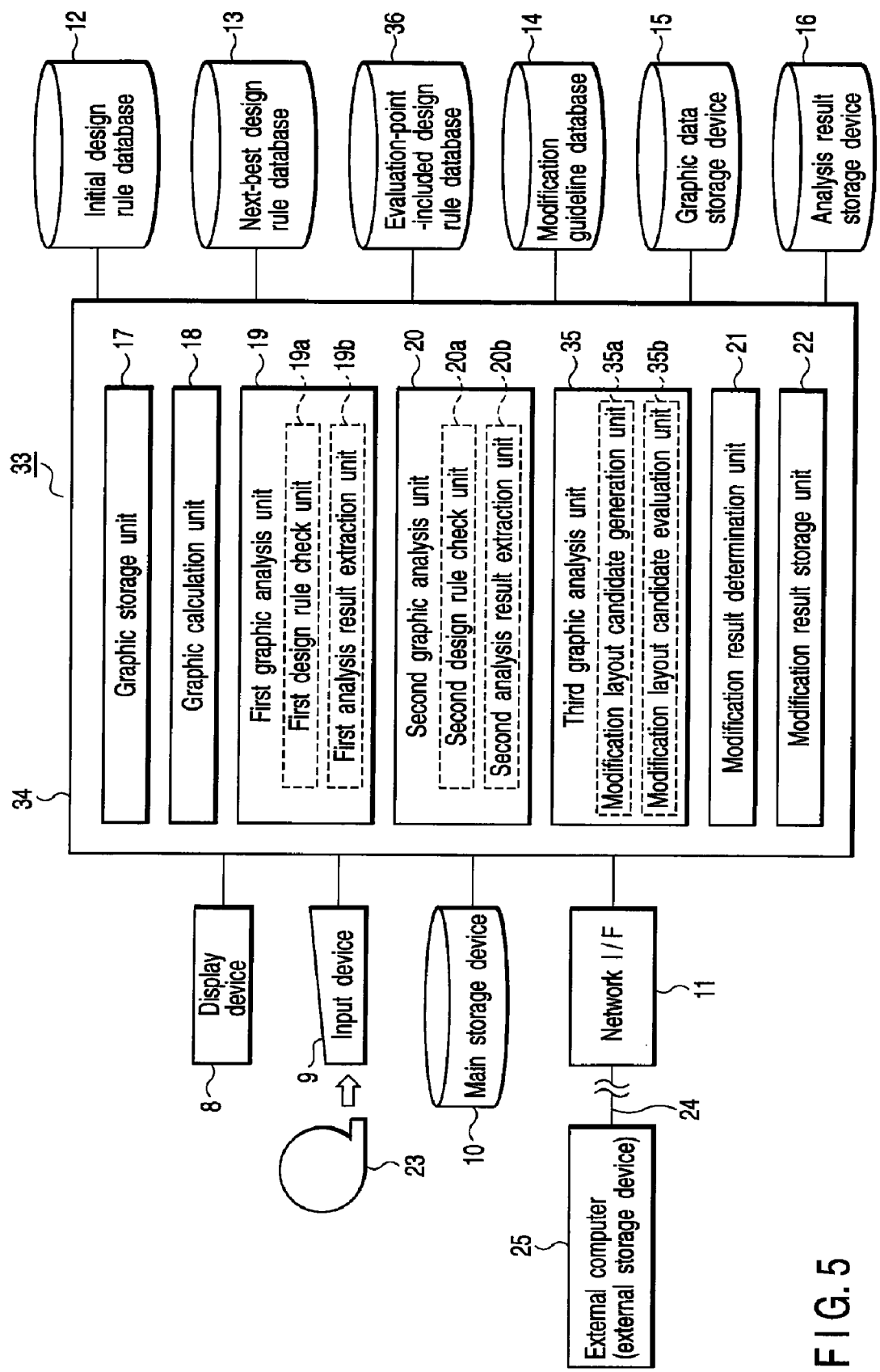
FIG. 5 is a block diagram simplistically showing a pattern forming apparatus according to the second embodiment.

With reference to FIG. 5, an explanation of a pattern forming apparatus 33 according to the embodiment will be described. More specifically, the pattern forming apparatus 33 is an apparatus to execute the pattern forming method according to the embodiment described above.

As shown in FIG. 5, the pattern forming apparatus 33 has almost the same configuration as that of the pattern forming apparatus 6 of the first embodiment described above. Unlike the apparatus main body unit 7 of the pattern forming apparatus 6, in addition to the first graphic analysis unit 19 and the second graphic analysis unit 20, a third graphic analysis unit 35 is arranged in an apparatus main body unit 34 of the pattern forming apparatus 33. In the third graphic analysis unit 35, a modified layout candidate generation unit 35*a* and a modified layout candidate evaluation unit 35*b* are arranged. Unlike the pattern forming apparatus 6, to the apparatus main body unit 34 of the pattern forming apparatus 33, as a peripheral device, in addition to the initial design rule database 12 and the next-best design rule database 13, an evaluation-point-included design rule database 36 is further connected as a third design rule database. The other configuration of the pattern forming apparatus 33 according to the embodiment is almost the same as that of the pattern forming apparatus 6 according to the first embodiment.

A pattern forming/verifying program according to the embodiment will be described below. The pattern forming/verifying program is, in particular, a program to realize the pattern forming method according to the embodiment. More specifically, the pattern forming/verifying program operates the pattern forming apparatus 33 to exert the function of the pattern forming apparatus 33, so that the pattern forming method according to the embodiment is executed by the pattern forming apparatus 33.

First, as in the first embodiment described above, prior to execution of the pattern forming method according to the embodiment by using the pattern forming apparatus 33, the pattern forming/verifying program according to the embodiment and the second design data automatic modification tool 31 are loaded onto the apparatus main body unit 34 of the pattern forming apparatus 33 in advance. The second design data automatic modification tool 31 is, like the first design data automatic modification tool 2, a program which substantially constitutes a part of the pattern forming/verifying program according to the embodiment or operates the pattern forming apparatus 33 in cooperation with the pattern forming/verifying program according to the embodiment. The recording medium 23 on which the pattern forming/verifying program and the second design data automatic modification tool 31 are recorded is loaded onto the input device 9 to be temporarily read by the apparatus main body unit 34. The pattern forming/verifying program and the second design data automatic modification tool 31 read by the apparatus main body unit 34 are stored in, for example, the main storage device 10. Thereafter, the pattern forming/verifying program and the second design data automatic modification tool 31 stored in the main storage device 10 are loaded onto an auxiliary storage unit such as a cache memory (not shown) in the apparatus main body unit 34.

As in the first embodiment described above, the initial design rule 1 is read from the initial design rule database 12 and input to the second design data automatic modification tool 31 stored in the apparatus main body unit 34. Similarly, the next-best design rule 4 is read from the next-best design rule database 13 and input to the second design data automatic modification tool 31. Similarly, the modification guideline 5 is read from the modification guideline database 14 and input to the second design data automatic modification tool 31. In addition to these inputs, by the same method as that in the first embodiment, the error-free design data 3 subjected to the first design rule check based on the initial design rule 1 is stored in the graphic storage unit 17 and input to the second design data automatic modification tool 31. Furthermore, in the embodiment, the evaluation-point-included design rule 32 stored in the evaluation-point-included design rule database 36 is read from the evaluation-point-included design rule database 36 and input to the second design data automatic modification tool 31.

Thereafter, the pattern forming/verifying program according to the embodiment is started to operate the apparatus main body unit 34 or the like, so that the step 11 (S11) to the step 17 (S17) or the step 18 (S18) and the step 4 (S4) are executed by the pattern forming apparatus 33. More specifically, the main steps of the pattern forming method according to the embodiment, as will be described later, are realized by a function controlled by the second design data automatic modification tool 31 in the functions exerted by the pattern forming apparatus 33 operated by the pattern forming/verifying program according to the embodiment.

First, step 11 (S11) of determining whether the processes from step 12 to step 17 or step 18 are finished with respect to all the error-free design data 3 input to the second design data automatic modification tool 31 is executed by the apparatus main body unit 34. This step 11 may be set to be executed by, for example, the modification result determination unit 21.

In particular, first, the modification result determination unit 21 reads the error-free design data 3 stored in the graphic storage unit 17. Subsequently, the modification result determination unit 21 determines whether the processes in step 12 to step 17 or step 18 are finished with respect to all the error-free design data 3 read from the graphic storage unit 17. As a matter of course, in the first step 11, the processes in step 12 to step 18 are not finished at all. Therefore, at least in the first step 11, the modification result determination unit 21 need not determine whether the processes in step 12 to step 18 are finished. In this case, the pattern forming/verifying program according to the embodiment may cause the apparatus main body unit 34 to immediately execute the next step 12 without causing the modification result determination unit 21 to substantially execute the first step 11.

Step 12 (S12) of selecting one piece of design data at a dangerous portion to be modified from the error-free design data 3 input to the second design data automatic modification tool 31 is executed by the apparatus main body unit 34. The step 12 may be set to be executed by, for example, the modification result determination unit 21. In particular, from the error-free design data 3 read by the modification result determination unit 21 from the graphic storage unit 17 in step 11, a part of design data at a portion which does not satisfy at least one of a request on design of a semiconductor device and a request on processes of manufacturing the semiconductor device is selected by the modification result determination unit 21.

Step 13 (S13) of automatically modifying the design data selected in step 12 on the basis of the modification guideline 5 is executed by the apparatus main body unit 34. In particular, first, the design data selected by the modification result determination unit 21 in step 12 is received by the graphic calculation unit 18. Subsequently, the graphic calculation unit 18 performs predetermined modification, on the basis of the modification guideline 5, of the design data 3 received from the modification result determination unit 21. The modification result is stored in the modification result storage unit 22.

Step 14 (S14) of checking the design data modified in step 13 again by the initial design rule 1 to determine whether the modified design data satisfies the initial design rule 1 is executed by the apparatus main body unit 34.

In particular, as in the first embodiment described above, the first design rule check unit 19a in the first graphic analysis unit 19 reads first reference graphic data from the graphic data storage device 15. Accordingly, the first design rule check unit 19a reads the error-free design data 3 modified on the basis of the modification guideline 5 from the modification result storage unit 22. Subsequently, the first design rule check unit 19a checks the error-free design data 3 modified on the basis of the modification guideline 5, on the basis of the initial design rule 1 while comparing the data with the first reference graphic data. Thereafter, the first design rule check unit 19a determines whether the modified design data subjected to the second initial design rule check satisfies the initial design rule 1.

When the first design rule check unit 19a determines in step 14 that the modified design data subjected to the second initial design rule check does not violate the initial design rule 1, as in the first embodiment described above, step 4 (S4) of outputting the modified design data as pattern forming design data used in actual pattern formation is executed by the apparatus main body unit 34. In particular, the first graphic analysis unit 19 temporarily moves the modified design data which does not violate the initial design rule 1 from the graphic storage unit 17 to store the modified design data in the modification result storage unit 22.

In contrast to this, when the first design rule check unit 19a determines in step 14 that the modified design data subjected to the second initial design rule check violates the initial design rule 1, step 15 (S15) of creating new design data to replace the modified design data determined to violate the initial design rule 1 is executed by the apparatus main body unit 34. In particular, at least one piece of design data of a modification candidate pattern departing from the initial design rule 1 is generated by the modified layout candidate generation unit 35a in the third graphic analysis unit 35. In the embodiment, as the design data of the modification candidate pattern departing from the initial design rule 1, a plurality of design data of modified layout candidates which outstrip the initial design rule 1 are generated by the modified layout candidate generation unit 35a. The step 14 may be set to be executed by the modification result determination unit 21.

Step 16 (S16) of selecting design data of a modified layout candidate having the smallest degree of departure from the initial design rule 1 from the design data of the modified layout candidates generated in step 15 is executed by the apparatus main body unit 34.

In particular, first, the modified layout candidate evaluation unit 35b in the third graphic analysis unit 35 selects a design rule which may be extended from the design rules of a plurality of categories with reference to the evaluation-point-included design rule 32 shown in FIG. 4. Subsequently, the modified layout candidate evaluation unit 35b selects the modified layout candidate having the maximum conformity point from the design rule which may be extended. In the embodiment, as described above, from the design rules of the categories A to F shown in FIG. 4, design rules C, D, and F which may be extended are selected by the modified layout candidate evaluation unit 35b. Subsequently, of the design rules C, D, and F, the design rule C and the design rule F having two points, which is higher than the conformity point of the design rule D, which is one, are selected and employed as the modified layout candidates by the modified layout candidate evaluation unit 35b.

Step 17 (S17) of checking the design data of the modified layout candidate selected in step 16 by the next-best design rule 4 to determine whether the design data satisfies the next-best design rule 4 is executed by the apparatus main body unit 34.

In particular, as in step 6 of the first embodiment described above, the second design rule check unit 20a in the second graphic analysis unit 20 reads the second reference graphic data from the graphic data storage device 15. Accordingly, the second design rule check unit 20a receives the design data of the modified layout candidate selected in step 16 from the modified layout candidate evaluation unit 35b. Then, the second design rule check unit 20a checks the design data of the modified layout candidate selected in step 16 based on the next-best design rule 4 while comparing the design data with the second reference graphic data.

When the second design rule check unit 20a determines in step 17 that the design data of the modified layout candidate employed in step 16 does not violate the next-best design rule 4, the step 4 (S4) is executed by the apparatus main body unit 34. More specifically, the apparatus main body unit 34 employs the design data of the modified layout candidate determined by the second design rule check unit 20a not to violate the next-best design rule 4 in step 17 as pattern forming design data used in actual pattern formation, so as to end the next-best design rule check. More specifically, the second graphic analysis unit 20 temporarily moves the design data of the modified layout candidate which does not violate the next-best design rule 4 from the second design rule check unit 20a to the modification result storage unit 22 and stores the design data in the modification result storage unit 22. Thereafter, the control operation returns to the step 11 and shifts to a process for the next modification candidate. More specifically, the step 11 to the step 17 are executed again on the next modification candidate by the apparatus main body unit 34.

In contrast to this, when the second design rule check unit 20a determines in step 17 that the design data of the modified layout candidate employed in step 16 violates the next-best design rule 4, the step 18 (S18) is executed by the apparatus main body unit 34. More specifically, the apparatus main body unit 34 excludes the design data of the modified layout candidate determined by the second design rule check unit 20a to violate the next-best design rule 4 in step 17 from the pattern forming design data, and adds the design data to an unmodifiable portion list as design data of a modification improper pattern so as to end the next-best design rule check. More specifically, the second graphic analysis unit 20 adds a recognition code such as a code representing "processed" or "rejection" to the design data of the modified layout candidate excluded from the pattern forming design data, and then the design data is stored in the graphic storage unit 17 independently of the unprocessed error-free design data 3 stored in the graphic storage unit 17. Thereafter, the control operation returns to the step 11 and shifts to a process for the next modification candidate. More specifically, the step 11 to the step 17 or the step 18 are also executed on the next modification candidate by the apparatus main body unit 34. The step 17 may be set to be executed by the modification result determination unit 21.

Subsequently, the processes from step 11 to step 17 or step 18 are repeatedly executed by the apparatus main body unit 34 on all the remaining design data 3 which are not selected in the first step 12 in all the design data 3 input to the second design data automatic modification tool 31 and checked by the initial design rule 1. After the modification result determination unit 21 confirms in step 11 that the processes in step 11 to step 17 or step 18 are performed on all the error-free design data 3 input to the second design data automatic modification tool 31, the step 4 is executed by the apparatus main body unit 34. More specifically, the modified design data at the portion which does not violate the initial design rule 1 is output by the apparatus main body unit 34 as pattern forming design data used in actual pattern formation.

Hereinafter, although a concrete and detailed explanation with drawings is omitted, as in the first embodiment, the following operation is executed by the apparatus main body unit 34. That is, the modified design data stored in the modification result storage unit 22 in step 14 and determined to satisfy the initial design rule 1, and the design data of the modification layout candidate stored in the modification result storage unit 22 in step 17 and determined to satisfy the next-best design rule 4 are sent to predetermined subsequent steps. For example, the apparatus main body unit 34 sends the modified design data stored in the modification result storage unit 22 as the pattern forming design data used in the actual pattern formation to a mask pattern forming line (not shown) through the network I/F 11.

This is the end of the pattern forming method realized by using the pattern forming/verifying program according to the embodiment, the pattern forming/verifying function of the pattern forming apparatus 33 executed by the program, and the pattern forming apparatus 33 operated by the pattern forming/verifying program according to the embodiment.

As described above, according to the second embodiment, the same effect as in the first embodiment described above can be obtained. In the second embodiment, unlike in the first embodiment, not only the initial design rule 1 and the next-best design rule 4, but also the evaluation-point-included design rule 32 in which the propriety of an extension of the design rule, a limit of an extension of the design rule, a priority used in conformity with the design rule, a priority used in conformity with the extended design rule and the like are set is referred to. In this manner, a modification layout having the smallest degree of departure from the initial design rule 1 can be rapidly and easily employed. Therefore, according to the second embodiment, formation and modification of design data of a pattern can be more efficiently and more uniformly performed according to requests on manufacturing processes or pattern design processes for a semiconductor device.

Third Embodiment

A third embodiment according to the present invention will be described below with reference to FIGS. 6, 7A, 7B, 7C, 8A, 8B, 9, and 10. The same reference numerals as in the first and second embodiments denote the same parts in the third embodiment, and a detailed description thereof will be omitted.

The embodiment relates to a technique that efficiently and easily forms an optimum design pattern on semiconductor manufacturing process parameters given in advance and, in particular, to a technique that verifies the propriety of a method of modifying an automatically modified pattern or layout and can improve the quality of design data of the pattern or the layout. The embodiment will be concretely described below in detail.

First, a pattern forming/verifying method according to the embodiment will be described below with reference to a flow of a verifying system for automatically modified design data shown in FIG. 6 and FIGS. 7A, 7B, 7C, 8A, and 8B. The pattern forming/verifying method according to the embodiment is characterized by using a difference between graphics of patterns or layouts before and after modification. In the following explanation, the pattern and the layout are collectively called patterns.

Figure 6:
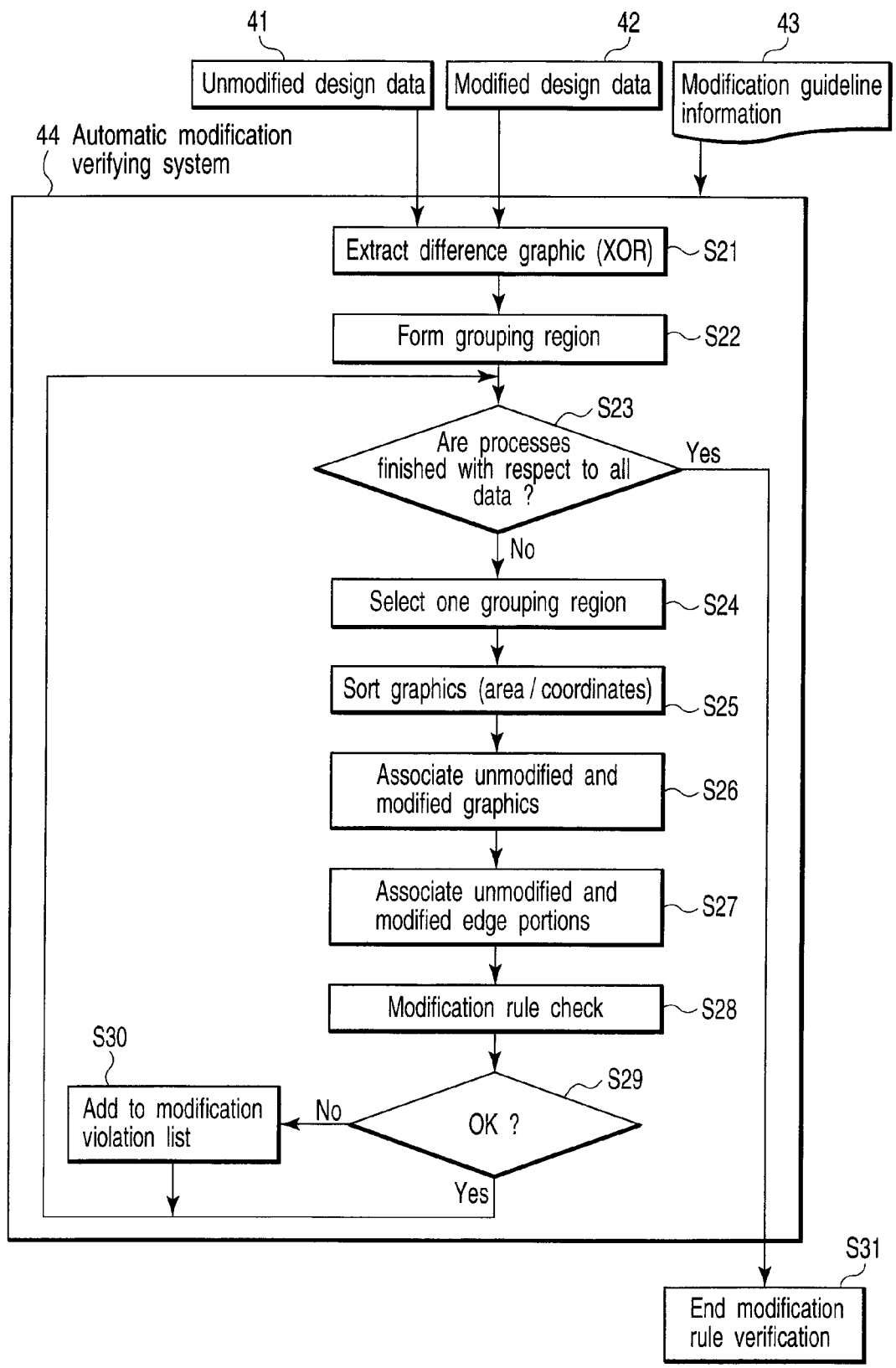
FIG. 6 is a diagram showing a flow chart of a pattern verifying method according to a third embodiment.
Figure 7A:
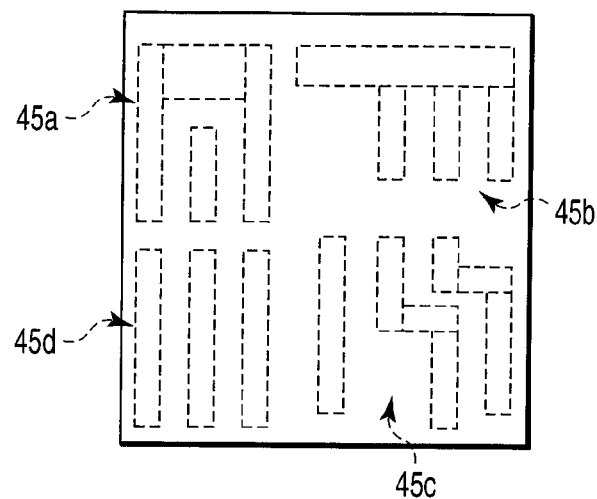
FIGS. 7A, 7B, and 7C show pattern verifying steps according to the third embodiment.
Figure 7B:
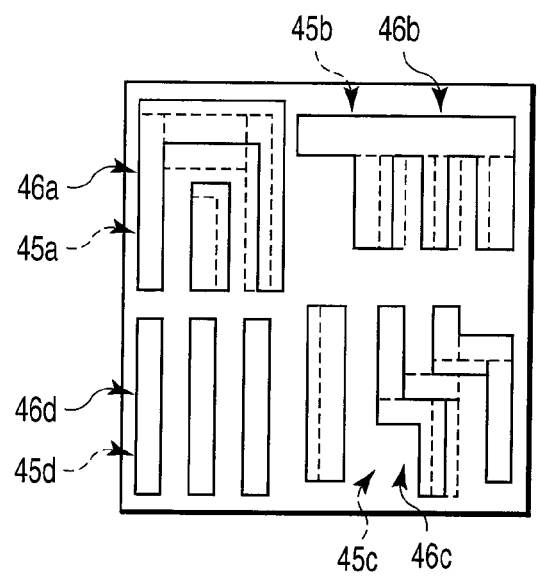

First, as shown in FIG. 6, prior to execution of the pattern forming/verifying method according to the embodiment, design data 41 obtained before a desired pattern formed in a semiconductor device (not shown) is modified, design data 42 obtained after modification corresponding to the design data 41 is performed, and information 43 related to a modification guideline used in a modification rule check (will be described later) are input to an automatic modification verifying system 44 according to the embodiment. FIG. 7A shows unmodified patterns 45a, 45b, 45c, and 45d corresponding to the respective unmodified design data 41 with broken lines. In FIG. 7B, modified patterns 46a, 46b, 46c, and 46d corresponding to the respective modified design data 42 are shown to overlap on the unmodified patterns 45 surrounded with solid lines. Thereafter, the pattern forming method according to the embodiment is executed by using the automatic modification verifying system 44. The automatic modification verifying system 44 executes processes according to step 21 (S21) to step 31 (S31) (will be described later).

Figure 7C:
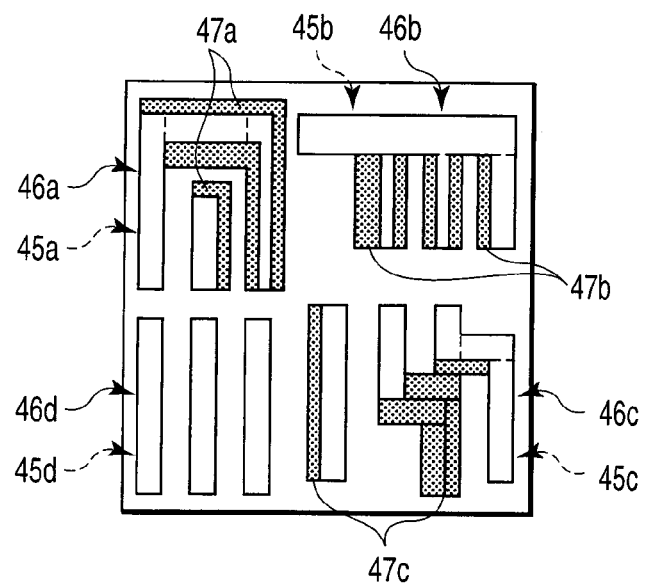

First, in the automatic modification verifying system 44, a difference (Exclusive OR: XOR) between design data of patterns obtained before and after the modification is extracted. In particular, design data related to a graphic of a different part between a pattern on the basis of the unmodified design data 41 and a pattern based on the modified design data 42 is extracted. This step is defined as step 21 (S21). FIG. 7C shows difference graphics 47a, 47b, and 47c between the unmodified patterns 45a, 45b, 45c, and 45d and the modified patterns 46a, 46b, 46c, and 46d as dotted patterns.

Figure 8A:
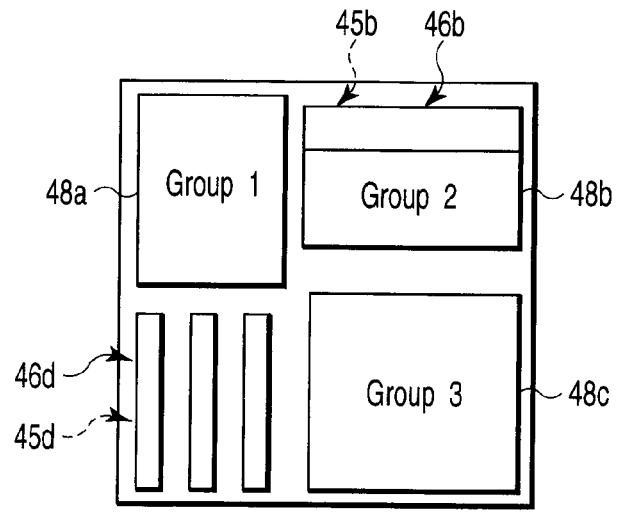
FIGS. 8A and 8B are diagrams showing pattern verifying steps according to the third embodiment.

The design data of the difference graphics 47a, 47b, and 47c extracted in step 21 are grouped in units of predetermined criteria to form at least one grouping region. As a criterion of the grouping, for example, intervals between the extracted difference graphics 47a, 47b, and 47c are used. In particular, when the intervals between the extracted difference graphics 47a, 47b, and 47c are equal to or smaller than a predetermined length, it may be assumed that the design data of the difference graphics 47a, 47b, and 47c are classified in the same grouping region. This step is defined as step 22 (S22). FIG. 8A shows the three grouping regions 48a, 48b, and 48c of group 1 to group 3 surrounded with solid lines.

It is then determined whether the processes in the step 21 and the step 22 are finished with respect to all the unmodified design data 41 and the modified design data 42 input to the automatic modification verifying system 44. This step is defined as step 23 (S23). As a matter of course, in the first step 23, the processes in step 21 and step 22 are finished only once. Therefore, at least in first step 23, it is not necessary to determine whether the processes in step 21 and step 23 are finished with respect to all the unmodified design data 41 and the modified design data 42. In this case, the next step 24 may be immediately performed without substantially executing the first step 23.

One grouping region is selected from the grouping regions formed in step 22. This step is defined as step 24 (S24).

Design data of graphics obtained before and after modification in the grouping region selected in step 24 are sorted into units of predetermined graphic groups. More specifically, design data of graphics obtained before and after modification are sorted into units of predetermined graphic groups for each of the created grouping regions. The area, coordinates, center coordinates, and the like of a graphic included in the same grouping region are used as the key for sorting. This step is defined as step 25 (S25).

Figure 8B:
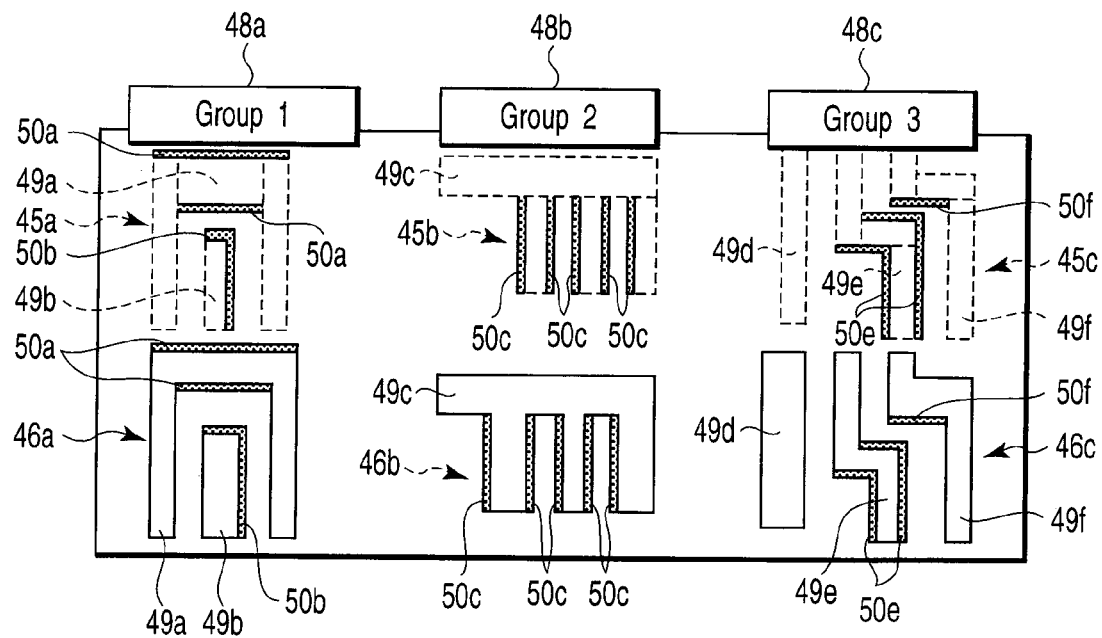

On the basis of a predetermined graphic group sorted in step 25, the design data of graphics obtained before and after the modification are associated with each other. This step is defined as step 26 (S26). As a method of associating the design data of the graphics obtained before and after the modification, for example, as in the step 25, first, the graphic design data are sorted by using the areas and coordinates of the graphics in the grouping region. Subsequently, the design data of the graphics may be associated with each other according to a sorting order. FIG. 8B shows a typical state in which the unmodified patterns 45a, 45b, 45c, and 45d and the modified patterns 46a, 46b, 46c, and 46d are sorted by one or three separated graphic groups 49a, 49b, 49c, 49d, 49e, and 49f constituting the patterns 45a, 45b, 45c, 45d, 46a, 46b, 46c, and 46d to associate the patterns with the graphic groups in units of the grouping regions 48a, 48b, and 48c.

Design data of edge portions of the graphics associated in step 26 and obtained before and after the modification are associated with each other. This is called step 27 (S27). FIG. 8B shows corresponding portions 50a, 50b, 50c, 50e, and 50f between the edge portions of the unmodified patterns 45a, 45b, 45c, and 45d and the edge portions of the modified patterns 46a, 46b, 46c, and 46d sorted and associated by the graphic groups 49a, 49b, 49c, 49d, 49e, and 49f as bold lines.

A modification rule check based on the modification guideline 43 is performed to movement before and after the modification of the edge portions 50a, 50b, 50c, 50e, and 50f associated in step 27. This step is defined as step 28 (S28). As items of the modification rule check, the following checks are performed. That is, it is checked whether the widths of the edge portions 50a, 50b, 50c, 50e, and 50f exceed the maximum value of an amount of modification when the edge portions 50a, 50b, 50c, 50e, and 50f are thickened or thinned, it is checked whether moving distances of the edge portions 50a, 50b, 50c, 50e, and 50f exceed the maximum value of a moving distance when the edge portions 50a, 50b, 50c, 50e, and 50f are moved, and it is checked whether the modified patterns 46a, 46b, 46c, and 46d conform to the modification guideline with respect to dangerous portions. FIG. 9 shows the moving distances of, for example, the edge portions 50a, 50b, 50c, 50e, and 50f of the items serving as targets of the modification rule check in step 28 such that the moving distances are classified by the grouping regions 48a and 48b and the graphic groups 49a, 49b, and 49c. FIG. 9 also shows categories to which the edge portions 50a, 50b, 50c, 50e, and 50f belong. In FIG. 9, the edge portions 50a, 50b, 50c, 50e, and 50f are shown so as to be classified into categories of two types, i.e., hsp1 and hsp2.

In step 28, it is determined whether the edge portions 50a, 50b, 50c, 50e, and 50f subjected to the modification rule check satisfy the modification guideline 43. This step is defined as step 29 (S29). For example, in this step 29, moving distances of the edge portions 50a, 50b, 50c, 50e, and 50f shown in FIG. 9 by actual modification are collated with the maximum moving distance of the edge portions 50a, 50b, 50c, 50e, and 50f regulated by the modification guideline 43 to determine whether the edge portions 50a, 50b, 50c, 50e, and 50f violate the modification guideline 43.

When it is determined in step 29 that the edge portions 50a, 50b, 50c, 50e, and 50f subjected to the modification rule check in step 28 do not violate the modification guideline 43, it is regarded that the edge portions 50a, 50b, 50c, 50e, and 50f are properly modified, and the modification rule check is ended. More specifically, verification of the propriety of the pattern modification in the grouping region selected in step 24 is ended. Thereafter, the control operation returns to step 23 and shifts to a process for the next grouping region.

In contrast to this, when the edge portions 50a, 50b, 50c, 50e, and 50f subjected to the modification rule check in step 28 include a portion determined in step 29 to violate the modification guideline 43, the violation portion is reported out to end the modification rule check. More specifically, the verification of the propriety of the pattern modification in the grouping region selected in step 24 is ended. In this case, the design data at the violation portion is excluded from pattern forming design data used in actual pattern formation and added to a modification violation list as design data of a modification-inviolate pattern. This step is defined as step 30 (S30). Thereafter, the control operation returns to the step 23 described above and shifts to a process for the next grouping region.

Subsequently, on all the remaining unmodified design data 41 and the modified design data 42 in which extraction of a difference graphic and formation of a grouping region are not performed in first step 21 and step 22 in all the unmodified design data 41 and the modified design data 42 input to the automatic modification verifying system 44, processes from step 23 to the step 29 or the step 30 are repeatedly executed. After it is confirmed in step 23 that the processes in step 23 to step 29 or step 30 are performed on all the unmodified design data 41 and the modified design data 42 input to the automatic modification verifying system 44, the control operation shifts to the next step 31 (S31). More specifically, verification of the modification rule of all the unmodified design data 41 and the modified design data 42 input to the automatic modification verifying system 44 is ended.

Although a concrete and detailed explanation with drawings will be omitted, the modified design data 42 determined in step 29 to satisfy the modification guideline 43, as in the first and second embodiments, is output as pattern forming design data used in actual pattern formation. The modified design data 42 output as the pattern forming design data used in the actual pattern formation is sent to a mask pattern forming line. This is the end of the pattern forming/verifying method according to the embodiment.

A configuration of a pattern forming/verifying apparatus 51 according to the embodiment will be described below with reference to FIG. 10. The pattern forming/verifying apparatus 51, in particular, is an apparatus that executes a pattern forming/verifying method according to the embodiment.

As shown in FIG. 10, the pattern forming/verifying apparatus 51 has the same configuration as that of the pattern forming apparatus 6 according to the first embodiment or the pattern forming apparatus 33 according to the second embodiment. However, unlike the apparatus main body units 7 and 34 of the pattern forming apparatuses 6 and 33, a grouping region forming unit 53 and a graphic sorting unit 54 are arranged in an apparatus main body unit 52 of the pattern forming/verifying apparatus 51 in place of the modification result determination unit 21. Accordingly, in the apparatus main body unit 52 of the pattern forming/verifying apparatus 51, a fourth graphic analysis unit 55 is arranged in place of the first to third graphic analysis units 19, 20, and 35. In the fourth graphic analysis unit 55, a graphic associating unit 55a, a graphic edge portion associating unit 55b, a modification rule check unit 55c, and an analysis result determination unit 55d are arranged. Unlike the pattern forming apparatuses 6 and 33, in the apparatus main body unit 52 of the pattern forming/verifying apparatus 51, the initial design rule database 12, the next-best design rule database 13, and the evaluation-point-included design rule database 36 are not arranged. The other configuration of the pattern forming/verifying apparatus 51 according to the embodiment is almost the same as that of each of the pattern forming apparatuses 6 and 33 according to the first and second embodiments.

The pattern forming/verifying program according to the embodiment will be described below. The pattern forming/verifying program is, in particular, a program to realize the pattern forming/verifying method according to the embodiment. More specifically, the pattern forming/verifying program operates the pattern forming/verifying apparatus 51 to exert the function of the pattern forming/verifying apparatus 51, so that the pattern forming/verifying method according to the embodiment is executed by the pattern forming/verifying apparatus 51.

As in the first and second embodiments, prior to execution of the pattern forming/verifying method according to the embodiment by using the pattern forming/verifying apparatus 51, the pattern forming/verifying program according to the embodiment and the automatic modification verifying system 44 are loaded onto the apparatus main body unit 52 of the pattern forming/verifying apparatus 51. The automatic modification verifying system 44, like the first design data automatic modification tool 2 according to the first embodiment and the second design data automatic modification tool 31 according to the second embodiment, is a program which substantially constitutes a part of the pattern forming/verifying program according to the embodiment or operates the pattern forming/verifying apparatus 51 in cooperation with the pattern forming/verifying program according to the embodiment.

The pattern forming/verifying program and the automatic modification verifying system 44 are temporarily read by the apparatus main body unit 52 in such a manner that the recording medium 23 on which the pattern forming/verifying program and the automatic modification verifying system 44 are recorded is loaded onto the input device 9. The pattern forming/verifying program and the automatic modification verifying system 44 read by the apparatus main body unit 52 are stored in, for example, the main storage device 10. Thereafter, the pattern forming/verifying program and the automatic modification verifying system 44 stored in the main storage device 10 are loaded onto an auxiliary storage unit such as a cache memory (not shown) in the apparatus main body unit 52. Subsequently, the modification guideline information 43 is read from the modification guideline database 14 and input to the automatic modification verifying system 44.

With these inputs, the unmodified design data 41 and the modified design data 42 are input to the automatic modification verifying system 44 stored in the apparatus main body unit 52. More specifically, as in the case in which the error-free design data 3 is loaded onto the apparatus main body units 7 and 34 in the first and second embodiments, a predetermined recording medium (not shown) on which the unmodified design data 41 and the modified design data 42 are recorded in advance is loaded onto the input device 9 to load the unmodified design data 41 and the modified design data 42 onto the apparatus main body unit 52. In this manner, the unmodified design data 41 and the modified design data 42 are input to the automatic modification verifying system 44 stored in the apparatus main body unit 52. In hardware, the unmodified design data 41 and the modified design data 42 are stored in the graphic storage unit 17.

Thereafter, the pattern forming/verifying program according to the present embodiment is started to operate the apparatus main body unit 52 or the like, and the step 21 (S21) to step 31 (S31) are executed by the pattern forming/verifying apparatus 51. More specifically, the main steps of the pattern forming/verifying method according to the embodiment are realized by functions controlled by the automatic modification verifying system 44 in the functions exerted by the pattern forming/verifying apparatus 51 operated by the pattern forming/verifying program according to the present invention as will be described later.

First, step 21 (S21) of extracting design data of a difference between the unmodified design data 41 and the modified design data 42 input to the automatic modification verifying system 44 is executed by the apparatus main body unit 52. More specifically, the graphic calculation unit 18 reads the unmodified design data 41 and the modified design data 42 stored in the graphic storage unit 17. Subsequently, the graphic calculation unit 18 extracts design data of difference graphics 47a, 47b, and 47c between the unmodified patterns 45a, 45b, 45c, and 45d based on the read unmodified design data 41 and the modified patterns 46a, 46b, 46c, and 46d based on the modified design data 42.

Step 22 (S22) of grouping the design data of the difference graphics 47a, 47b, and 47c extracted in step 21 in units of predetermined criteria to form at least one grouping region is executed by the apparatus main body unit 52. More specifically, the graphic calculation unit 18 gives the design data of the difference graphics 47a, 47b, and 47c extracted by the graphic calculation unit 18 to the grouping region forming unit 53. Subsequently, the grouping region forming unit 53 groups the design data of the difference graphics 47a, 47b, and 47c received from the graphic calculation unit 18 in units of the predetermined criteria to form at least one grouping region. In this case, as described above, the grouping region forming unit 53 forms the three grouping regions 48a, 48b, and 48c of group 1 to group 3.

Step 23 (S23) of determining whether the processes in the step 21 and the step 22 are finished with respect to all the unmodified design data 41 and the modified design data 42 input to the automatic modification verifying system 44 is executed by the apparatus main body unit 52. The step 23 may be set to be executed by, for example, the graphic calculation unit 18 and the grouping region forming unit 53.

More specifically, first, the graphic calculation unit 18 reads the unmodified design data 41 and the modified design data 42 stored in the graphic storage unit 17. Subsequently, the graphic calculation unit 18 determines whether the process in step 21 is finished with respect to all the unmodified design data 41 and the modified design data 42 read from the graphic storage unit 17. As a matter of course, in the first step 23, the process in step 21 is not finished at all. Therefore, at least in first step 23, the graphic calculation unit 18 does not need to determine whether the process in step 21 is finished. In this case, the pattern forming/verifying program may cause the apparatus main body unit 34 to immediately execute the next step 24 without causing the graphic calculation unit 18 and the grouping region forming unit 53 to substantially execute the first step 23.

When the process in step 21 is finished with respect to all the unmodified design data 41 and the modified design data 42 read from the graphic storage unit 17, as a matter of course, the graphic calculation unit 18 determines in the step 23 that the process in step 21 is finished. However, even though the process in step 21 is finished with respect to all the unmodified design data 41 and the modified design data 42, the process in step 22 is not always finished with respect to the design data of the difference graphic between all the unmodified design data 41 and the modified design data 42 extracted by the graphic calculation unit 18 in step 21. In this case, the determination in step 23 may be executed by the grouping region forming unit 53. More specifically, even though the graphic calculation unit 18 determines "YES" in step 23, it may be determined that the processes in step 21 and step 22 are not finished with respect to all the unmodified design data 41 and the modified design data 42 input to the automatic modification verifying system 44 if the grouping region forming unit 53 does not determine "YES". In this case, the pattern forming/verifying program according to the embodiment may cause the apparatus main body unit 34 to immediately execute the next step 24.

More specifically, the grouping region forming unit 53 is set to determine whether the process in step 22 is finished each time the graphic calculation unit 18 forms a grouping region with respect to the design data of the difference graphic extracted in step 21. As described above, even though the process in step 21 performed by the graphic calculation unit 18 is finished with respect to all the unmodified design data 41 and the modified design data 42 input to the automatic modification verifying system 44 in step 23, when the process in step 22 by the grouping region forming unit 53 is not finished with respect to the design data of all the extracted difference graphics, the grouping region forming unit 53 determines "NO". More specifically, "NO" is determined in step 23. The grouping region forming unit 53 determines "YES" after the graphic calculation unit 18 confirms that formation of the grouping regions of the design data of all the difference graphics extracted in step 21 is finished. More specifically, "YES" is determined in step 23. In this manner, in the embodiment, unless both the graphic calculation unit 18 and the grouping region forming unit 53 determine "YES", "NO" is determined in step 23.

Step 24 of selecting one grouping region from the grouping regions 48a, 48b, and 48c formed in step 22 is executed by the apparatus main body unit 52. Like the step 22, the step 24 may be executed by the grouping region forming unit 53.

Step 25 (S25) of sorting the design data of the graphics 45a, 45b, 45c, 45d, 46a, 46b, 46c, and 46d obtained before and after the modification in the grouping region selected in step 24 by the predetermined graphic groups 49a, 49b, 49c, 49d, 49e, and 49f is executed by the apparatus main body unit 52. More specifically, the step 25 may be executed by a graphic sorting unit 54. After the graphic sorting unit 54 receives, from the grouping region forming unit 53, design data of the patterns 45a, 45b, 45c, 45d, 46a, 46b, 46c, and 46d obtained before and after the modification and included in the grouping region formed and selected by the grouping region forming unit 53, the graphic sorting unit 54 sorts the design data of the graphics constituting the patterns 45a, 45b, 45c, 45d, 46a, 46b, 46c, and 46d by the predetermined graphic groups 49a, 49b, 49c, 49d, 49e, and 49f.

Step 26 (S26) of associating the design data of the graphics 45a, 45b, 45c, 45d, 46a, 46b, 46c, and 46d obtained before and after the modification and sorted in step 25 is executed by the apparatus main body unit 52. More specifically, the step 26 may be executed by the graphic associating unit 55a in the fourth graphic analysis unit 55. After the graphic associating unit 55a receives, from the graphic sorting unit 54, the design data of the graphics 45a, 45b, 45c, 45d, 46a, 46b, 46c, and 46d sorted by the graphic sorting unit 54, the graphic associating unit 55a sorts the design data of the graphics 45a, 45b, 45c, 45d, 46a, 46b, 46c, and 46d by using the areas and the coordinates of the graphics as keys. Subsequently, the graphic associating unit 55a associates the design data of the graphics 45a, 45b, 45c, 45d, 46a, 46b, 46c, and 46d with each other in the sorting order.

Step 27 (S27) of associating the design data of the edge portions of the graphics 45a, 45b, 45c, 45d, 46a, 46b, 46c, and 46d associated in step 26 and obtained before and after the modification is executed by the apparatus main body unit 52. More specifically, the step 27 may be executed by the graphic edge portion associating unit 55b in the fourth graphic analysis unit 55. After the graphic edge portion associating unit 55b receives the design data of the graphics 45a, 45b, 45c, 45d, 46a, 46b, 46c, and 46d associated with each other by the graphic associating unit 55a from the graphic associating unit 55a, the graphic edge portion associating unit 55b associates the design data of the edge portions 50a, 50b, 50c, 50e, and 50f of the graphics 45a, 45b, 45c, 45d, 46a, 46b, 46c, and 46d with each other.

Step 28 (S28) of performing a modification rule check based on the modification guideline 43 to movements before and after the modification of the edge portions 50a, 50b, 50c, 50e, and 50f associated with each other in step 27 is executed by the apparatus main body unit 52. More specifically, the step 28 may be executed by the modification rule check unit 55c in the fourth graphic analysis unit 55. The modification rule check unit 55c performs the modification rule check on the basis of the modification guideline information 43 read from the modification guideline database 14.

Step 29 (S29) of determining whether the edge portions 50a, 50b, 50c, 50e, and 50f subjected to the modification rule check in step 28 satisfy the modification guideline 43 is executed by the apparatus main body unit 52. More specifically, the step 28 may be executed by the analysis result determination unit 55d in the fourth graphic analysis unit 55. The analysis result determination unit 55d determines whether modification of the edge portions 50a, 50b, 50c, 50e, and 50f subjected to the modification rule check by the modification rule check unit 55c violates the modification guideline 43.

When the analysis result determination unit 55d determines in step 29 that the modification to the edge portions 50a, 50b, 50c, 50e, and 50f subjected to the modification rule check in step 28 does not violate the modification guideline 43, the modification rule check unit 55c ends the modification rule check while regarding that the edge portions 50a, 50b, 50c, 50e, and 50f are properly modified. More specifically, the apparatus main body unit 52 employs the modified design data of the graphics 46a, 46b, 46c, and 46d in the grouping region selected in step 24 as pattern forming design data used in actual pattern formation to end verification of the propriety of the modification to the graphics 46a, 46b, 46c, and 46d in the grouping region selected in step 24. More specifically, the fourth graphic analysis unit 55 temporarily moves the design data of the modified patterns 46a, 46b, 46c, and 46d which do not violate the modification guideline 43 from the analysis result determination unit 55d in the fourth graphic analysis unit 55 to the modification result storage unit 22 and stores the design data in the modification result storage unit 22. Thereafter, the control operation returns to the step 23 and then shifts to a process for the next grouping region. More specifically, the step 21 to step 29 are executed by the apparatus main body unit 52 to the next grouping region.

In contrast to this, step 30 (S30) of, when the edge portions 50a, 50b, 50c, 50e, and 50f subjected to the modification rule check in step 28 include a portion determined by the analysis result determination unit 55d in step 29 to violate the modification guideline 43, reporting out the violation portion to end the modification rule check is executed by the apparatus main body unit 52. More specifically, the apparatus main body unit 52 excludes design data of a modified pattern including an edge portion determined by the analysis result determination unit 55d in step 29 to violate the modification guideline 43 from the pattern forming design data, and adds the design data to a modification-violation portion list as design data of a modification improper pattern so as to end the verification of propriety of the modification to the modified patterns 46a, 46b, 46c, and 46d in the grouping region selected in step 24. More specifically, the fourth graphic analysis unit 55 adds a recognition code such as a code representing "processed" or "rejection" to the design data of the pattern excluded from the pattern forming design data and then stores the design data in the graphic storage unit 17 independently of the unprocessed modified design data 42 stored in the graphic storage unit 17. Thereafter, the control operation returns to the step 23 and shifts to a process for the next grouping region. More specifically, the step 21 to the step 29 or the step 30 are also executed for the next grouping region by the apparatus main body unit 52.

Subsequently, the processes from step 23 to step 29 or step 30 are repeatedly executed by the apparatus main body unit 52 on all the remaining unmodified design data 41 and the remaining modified design data 42 in which the extraction of the different graphics and the formation of grouping regions are not performed in the first step 21 and the step 22 in all the unmodified design data 41 and the modified design data 42 input to the automatic modification verifying system 44. After the graphic calculation unit 18 and the grouping region forming unit 53 confirm in step 23 that the processes in step 21 to step 29 or step 30 are performed on all the unmodified design data 41 and the modified design data 42 input to the automatic modification verifying system 44, step 31 (S31) is executed by the apparatus main body unit 34. More specifically, the verification of the modification rules of all the unmodified design data 41 and the modified design data 42 input to the automatic modification verifying system 44 is ended.

Thereafter, although a concrete and detailed explanation with drawings are omitted, the design data 42 of the modified patterns stored in the modification result storage unit 22 in step 29 and determined to satisfy the modification guideline 43, as in the first and second embodiments, is output as pattern forming design data used in actual pattern formation. An operation of sending the design data 42 of the output modified patterns to a predetermined subsequent step is executed by the apparatus main body unit 52. For example, the apparatus main body unit 52 sends the design data 42 of the modified patterns stored in the modification result storage unit 22 to a mask pattern forming line (not shown) through the network I/F 11 as the pattern forming design data used in actual pattern formation.

This is the end of the pattern forming method realized by using the pattern forming/verifying program according to the embodiment, the pattern forming/verifying function of the pattern forming/verifying apparatus 51 executed by the program, and the pattern forming/verifying apparatus 51 operated by the pattern forming/verifying program according to the embodiment.

As described above, according to the third embodiment, the same effects as those of the first and second embodiments can be obtained. The third embodiment is combined with the first and second embodiment to make it possible to efficiently and uniformly verify the propriety of the patterns formed and modified by the pattern forming methods according to the first and second embodiments. Consequently, formation and modification of the pattern design data can be further efficiently and further uniformly performed according to requests of manufacturing processes or pattern design processes for a semiconductor device. Determinations in step 23 and step 29 may be set to be performed by the analysis result determination unit 55d without using the graphic calculation unit 18 and the grouping region forming unit 53.

Fourth Embodiment

A fourth embodiment according to the present invention will be described below without drawings. An explanation will be made such that the same reference numerals as in the first to third embodiments denote the same parts in the fourth embodiment.

In the embodiment, there will be described, without drawings, a technique for forming an exposure mask based on design data of a pattern formed and verified by using at least one of the first to third embodiments.

First, design data of a desired pattern is formed by using at least one of the first to third embodiments. Subsequently, an exposure pattern is formed on an exposure mask (not shown) on the basis of the design data. In this manner, the exposure mask having the desired exposure pattern can be formed.

As described above, according to the fourth embodiment, a technique according to at least one of the first to third embodiments is used. In this manner, an exposure pattern for various semiconductor elements or wiring layers can be efficiently and easily formed on an exposure mask at a high accuracy. For this reason, the exposure mask improved in accuracy, reliability, and quality can be efficiently and easily produced.

Fifth Embodiment

A fifth embodiment according to the present invention will be described below without drawings. An explanation will be made such that the same reference numerals as in the first to fourth embodiment denote the same parts in the fifth embodiment.

In the embodiment, a technique for manufacturing a semiconductor device by using an exposure mask formed by using the fourth embodiment will be described below without drawings.

First, an exposure pattern is sent onto a resist film on a semiconductor substrate (not shown) by using an exposure mask according to the fourth embodiment, and the resist film is developed to form a resist pattern on the resist film. Subsequently, a film to be processed or a semiconductor substrate arranged under the resist film is processed by etching or the like along the resist pattern formed on the resist film. In this manner, a desired pattern can be formed on the film to be processed or the semiconductor substrate. Thereafter, the semiconductor substrate on which the pattern is formed is subjected to a transistor manufacturing step, a wiring forming step, a dicing step, a chip mounting step, a bonding step, a molding step, and the like. In this manner, a desired semiconductor device (not shown) according to the embodiment is obtained.

As described above, according to the fifth embodiment, pattern exposure is performed by using an exposure mask according to the fourth embodiment. In this manner, since the pattern can be formed at a high accuracy, various fine semiconductor devices, wiring layers, or the like can be efficiently and easily formed on a semiconductor substrate or the like. For this reason, the pattern is formed at a high accuracy, and a high-quality semiconductor device which is improved in performance, reliability, quality, yield, and the like can be efficiently and easily manufactured.

A pattern forming method, a pattern verifying method, a pattern forming/verifying program, and a method of manufacturing a semiconductor device according to the present invention are not limited to the first to fifth embodiments. The configurations of these methods or programs or parts of manufacturing steps or the like can be changed into various settings, or the various settings can be performed by being arbitrarily and properly combined and used.

For example, when the pattern forming/verifying programs according to the first to third embodiments are executably recorded on the main body units 7, 34, and 52 of the pattern forming/verifying apparatuses 6, 33, and 51 serving as computers, a recording state or a recording format can be arbitrarily set. For example, as the recording medium 23 on which the pattern forming/verifying program is recorded, a magnetic disk such as a flexible disk or a hard disk, an optical disk such as a CD, a DVD, or an MO, a semiconductor memory, or the like can be used. Furthermore, the pattern forming/verifying program, for example, as shown in FIG. 2, may be stored in the various external computers 25, the storage device 25, or the like connected to the apparatus 6, 33, or 51 through the electric communication line 24 such as a LAN or the Internet serving as a communication medium. In particular, the pattern forming/verifying program may be stored in the computer 25, the server 25, or the like higher rank computer than the pattern forming/verifying apparatus 6, 33, or 51 such as a host computer which manages all the series of processes of manufacturing a semiconductor device. In this case, the pattern forming/verifying program may be temporarily read by the apparatus main body unit 7, 34, or 52 from the external computer 25 or the external storage device 25 through the electric communication line 24 and the network I/F 11, and then stored in the main storage device 10. The electric communication line 24 may be of a wired type or a wireless type.

In addition, as the main storage device 10 connected to the apparatus main body unit 7, 34, or 52, a recording medium (storage device) such as a magnetic disk such as a flexible disk or a hard disk, an optical disk such as a CD, a DVD, or an MO, a semiconductor memory, or the like in which data or a program to be recorded thereon is arbitrarily rewritable (updatable) can be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method comprising:
performing, by a computer, a first design-rule check on design data of a pattern to be formed in a semiconductor substrate according to a first design rule;
modifying, by a computer, design data that has been subjected to the first design-rule check on the basis of a modification guideline regulated by a criterion, the criterion satisfying at least one of a request on a design of a semiconductor device or a request on processes of manufacturing the semiconductor device;
performing, by a computer, a second design-rule check on the modified design data also according to the first design rule;
outputting, by a computer, a first portion of the modified design data which does not violate the first design rule as pattern forming design data used in actual pattern formation;
extracting a second portion of the modified design data which violates the first design rule;
performing a third design-rule check, according to a second design rule, on only the second portion of the modified design data, the second design rule having an allowable range wider than that of the first design rule;
outputting, by a computer, a first sub-portion of the second portion of the modified design data, which does not violate the second design rule, as the pattern forming design data;
extracting a second sub-portion of the second portion of the modified design data, which violates the second design rule; and
performing one of redesigning or adjusting the modification guideline for only the second sub-portion of the second portion of modified design data to make the second sub-portion of the second portion of modified design data satisfy the second design rule.

2. The method according to claim 1, wherein
the first design rule is a design rule to confirm propriety of the design data.

3. The method according to claim 1, wherein
a process margin of the first design rule is set on the safe side on the manufacturing processes.

4. The method according to claim 1, wherein
a process margin of the second design rule is set to a minimum amount obtained by reducing a margin used in the manufacturing processes.

5. The method according to claim 1, further comprising:
a regulation of at least one of a measure, a size, and an interval of the pattern, the regulation being added to the first design rule.

6. The method according to claim 5, further comprising:
another regulation of at least one of a measure, a size, and an interval of the pattern, such regulation being added to the second design rule and having an allowable range wider than that of the regulation added to the first design rule.

7. The method according to claim 1, wherein
coordinates of a modified pattern, contents of a design rule which violates the second design rule, and data related to the applied second design rule are attached to the modified design data which does not violate the second design rule.

* * * * *